United States Patent
Inomata et al.

[11] Patent Number: 6,069,820
[45] Date of Patent: May 30, 2000

[54] SPIN DEPENDENT CONDUCTION DEVICE

[75] Inventors: Koichiro Inomata; Yoshiaki Saito; Tatsuya Kishi, all of Kanagawa-ken, Japan

[73] Assignee: Kabushiki Kaisha Toshiba, Kawasaki, Japan

[21] Appl. No.: 09/247,300

[22] Filed: Feb. 10, 1999

[30] Foreign Application Priority Data

Feb. 20, 1998 [JP] Japan .................................. 10-039343
Feb. 20, 1998 [JP] Japan .................................. 10-039344

[51] Int. Cl.[7] ...................................................... G11C 7/00
[52] U.S. Cl. ........................................... 365/171; 365/173
[58] Field of Search ..................... 365/171, 173, 365/232

[56] References Cited

U.S. PATENT DOCUMENTS 5,978,257  11/1999  Zhu et al. .............................. 365/173

OTHER PUBLICATIONS

F. Schelp, et al. "Spin–Dependent Tunneling Between Ferromagnetic Metals In A New Type Of Tunnel Junction (Abstract)", J. Appl. Phys., vol. 81 No. 8, Apr. 15, 1997, p. 5508.

M.N. Baibich, et al. "Giant Magnetoresistance of (001) FE/(001) CR Magnetic Superlattices", Physical Review Letters, vol. 61 No. 21, Nov. 21, 1988, pp. 2472–2475.

D.H. Mosca, et al. "Oscillatory Interlayer Coupling And Giant Magnetoresistance In CO/CU Multilayers (Letter to the Editor)", Journal of Magnetism and Magnetic Materials, vol. 94, 1991, pp. L1–L5.

S.S.P. Parkin, et al. "Oscillatory Magnetic Exchange Coupling Through Thin Copper Layers", Physical Review Letters, vol. 66 No. 16, Apr. 22, 1991, pp. 2152–2155.

W.P. Pratt, et al. "Perpendicular Giant Magnetoresistance Of AG/CO Multilayers", Physical Review Letters, vol. 66 No. 23, Jun. 10, 1991, pp. 3060–3063.

A.E. Berkowitz, et al. "Giant Magnetoresistance In Heterogeneous CU–CO Alloys", Physical Review Letters, vol. 68 No. 25, Jun. 22, 1992, pp. 3745–3748.

Jagadeesh S, Moodera, et al. "Ferromagnetic–Insulator–Ferromagnetic Tunneling: Spin–Dependent Tunneling And Large Magnetoresistance In Trilayer Junctions (Invited)", J. Appl. Phys., vol. 79 No. 8, Apr. 15, 1996, pp. 4724–4729.

Keiji Ono, et al. "Enhanced Magnetic Valve Effect And Magneto–Coulomb Oscillations In Ferromagnetic Single Electron Transistor", Journal of the Physical Society of Japan, vol. 66 No. 5, May, 1997, pp. 1261–1264.

L.F. Schelp, et al. "Spin–Dependent Tunneling With Coulomb Blockade", Physical Review, vol. 56 No. 10, Sep. 1, 1997, pp. 5747–5750.

J.S. Moodera, et al. "Large Magnetoresistance At Room Temperature In Ferromagnetic Thin Film Tunnel Junctions", Physical Review Letters, vol. 74 No. 16, Apr. 17, 1995, pp. 3273–3276.

*Primary Examiner*—Terrell W. Fears
*Attorney, Agent, or Firm*—Oblon, Spivak, McClelland, Maier & Neustadt, P.C.

[57] ABSTRACT

A discrete energy levels are introduced in a ferromagnetic layer of a magnetic device, and tunnel current flows through a plurality of tunnel junctions. The tunnel junctions are disposed between first and second electrodes and the first ferromagnetic layer is interposed between the two tunnel junctions. Variations of the tunnel current depend on the relationship between magnetization directions of the ferromagnetic layer and another ferromagnetic layer. Tunnel current varies between parallel relation and anti-parallel relation.

31 Claims, 23 Drawing Sheets

SPIN DEPENDENT CONDUCTION DEVICE

BACKGROUND OF THE INVENTION

1. Field of the Invention

The present invention relates to spin dependent conduction devices, and more particularly, spin dependent conduction devices comprising a plurality of ferromagnetic tunnel junctions and utilizing a discrete energy level of ferromagnetic layer between the ferromagnetic tunnel junctions.

2. Discussion of the Background

A magnetoresistance effect (MR) is a phenomena in which the resistance of ferromagnetic material, such as NiFe alloy, varies dependently on the intensity of applied magnetic fields. An MR element utilizes such phenomena and is used as a magnetic sensor or a magnetic head. The MR amplitude of the NiFe alloy is around 2 to 3%; however, a larger amplitude is required to obtain magnetic recording of higher density.

A metal artificial lattice film which exhibits a giant magnetoresistance effect (GMR) was reported in publications, 61 *Phys. Rev. Lett.*, 2472(1988), 94 *J. Mag. Mater.*, L1(1991), and 66 *Phys. Rev. Lett.*, 2152(1991). The film comprises a plurality of ferromagnetic layers and nonmagnetic layers interposed between each of the ferromagnetic layers. The electrons scattering characteristic in the film depends on spin directions of ferromagnetic layers of the film. The film has about a 10 or 20% MR amplitude. Many layers are needed to obtain a high MR amplitude, and the saturation magnetization is as much as several Tesla (T). These characteristics are not preferable for applying the film to the magnetic head.

Another mechanism has been identified in which the resistance between two uncoupled ferromagnetic layers is observed to vary as the cosine of the angle between the magnetization of the two layers and is independent of the direction of current flow. This is termed as spin valve (SV) magnetoresistance in U.S. Pat. No. 5,206,590. The MR amplitude of the mechanism is about 4–8%, and the specific resistance is tens of micro ohms-cm. Therefore, a large current is required to sense small applied magnetic fields.

It was also reported that a vertical magnetoresistance effect is obtained when current flows in a vertical direction of the film surface of an artificial lattice multilayer in 66 *Phys. Rev. Lett.*, 3060(1991). The resistance of the film is too small because of a short current path and the use of a metal multilayer. Also, in order to obtain the effect at room temperature, it is necessary to form a film having a submicron pattern.

It was reported that the GMR could be obtained by using a granular ferromagnetic film. The film comprises dispersed magnetic fine-grains in a nonmagnetic metal material layer as reported in 68 Phys. Rev. Lett., 3745(1992). Spins of the fine-grains have mutually irregular directions, and the film shows high resistance with no applied field. When the magnetic fields are applied, the resistance of the film decreases. The fine-grains have super-paramagnetism and large saturation magnetization fields.

Another mechanism of the GMR differs from the spin dependent scattering. The mechanism is obtained by a structure including a ferromagnetic layer/ an insulator layer/ a ferromagnetic layer. The coercive force of one ferromagnetic layer is larger than that of the other layer, and a tunnel current is obtained at a specific voltage. Resistance changes depend on whether the spin direction of both ferromagnetic layers are parallel or antiparallel. The spin direction of the small coercive force layer is controlled by applied magnetic fields. The film structure and the mechanism is so simple and it may show about 20% MR amplitude at room temperature. However, the film thickness of the insulator layer is less than several nanometers, and it is difficult to form a stable thin insulator layer. Also, the resistance of several square micrometers area becomes the order of mega ohms, and low speed performance and increasing noise become a problem when a high resistance insulator layer is used (see 74 *Phys. Rev. Lett.*, 3273 (1995)).

Double tunnel junctions of Fe/Ge/Fe/Ge/ferromagnetic material are expected by theoretical calculations that a large MR amplitude due to spin polarization resonance tunnel effect may be shown (see B56 *Phys. Rev.*, 5484 (1997)). However, the MR amplitude was calculated for a temperature of 8° K., and the device was not actually formed at that time.

Other tunnel junctions having $Al_2O_3$/granular layer/$Al_2O_3$ were also reported in R56 *Phys. Rev.*, R5747 (1997). The granular layer comprises Co grains formed in an $Al_2O_3$ material. Each of the Co grains has a diameter of several nanometers, does not have uni-direction and shows paramagnetic at 120° K. Therefore, the granular layer does not spin switch at low temperature even though it is provided with a large magnetic field of more than 0.5 Tesla and the device does not show spin resonance tunnel effect.

A tri-terminal device such as a spin transistor comprising a ferromagnetic metal layer, a nonmagnetic metal layer, and another ferromagnetic metal layer was also reported. An output voltage is obtained between one of the ferromagnetic metal layers and the nonmagnetic layer when a voltage is applied between those layers, and the positive/negative characteristic of the output voltage depends on whether the spin directions of the two ferromagnetic metal layers are parallel or antiparallel, as reported in 79 *J. Appl. Phys.*, 4724(1996). However, the metal layers of this transistor prohibit an output of more than nanovolts and no gain current is obtained.

A Coulomb Blockade effect was also reported to exhibit the MR in 66 *J. Phys. Soc. Jpn.*, 1261(1997). The term, coulomb blockade, describes the phenomena that energy increases about $Ec=e^2/2C$ when an electron tunnels at a small capacitor C. At a small capacitor, the increase of Ec prohibits tunneling of the electron. However, a high order tunnel current (resonant tunnel current) flows and the resistance of the device, which is in proportion to the product of the two tunnel junction's resistance, increases. Therefore, the MR amplitude increases.

A Magnetic Random Access Memory (MRAM) is also reported in which one ferromagnetic layer of stacked ferromagnetic layer/nonmagnetic layer/ferromagnetic layer is used for recording and another ferromagnetic layer is used for reproducing layer. The device requires a current source for providing magnetic fields to the device at both recording and reproducing.

Conventional semiconductor devices utilize electric charge of electrons or holes and do not utilize spin of the electrons.

The conventional semiconductor devices and the resonant tunnel device utilized the electric charge of the electron or holes and did not utilize spin of the electron.

The conventional spin dependent conduction devices utilizing the magnetic spin are the spin valve (SV) element, and the ferroelectric tunnel junction device. The MR amplitude of these spin conduction devices is less than 20%. As a result, the reproducing sensitivity and output voltage are small. The MRAM must be provided with a current source for providing magnetic fields.

The conventional spin transistor exhibits small output voltage and has an insufficient current gain.

SUMMARY OF THE INVENTION

An object of the present invention is to resolve the above problems of conventional technology and provide a conduction device having spin dependent conduction of large MR amplitude. Another object of the present invention is to provide a magnetic device having a current gain characteristic. A third object of the present invention is to provide a magnetic device, such as a magnetic head, a spin transistor, a magnetic memory device, and an integrated memory device having a spin dependent conduction characteristic.

In a first aspect, the present invention provides a magnetic device comprising first and second tunnel barrier layers, a first ferromagnetic layer disposed between the first and the second tunnel barrier layers and having a discrete energy level, a second ferromagnetic layer disposed adjacent to one of the first and the second tunnel barrier layers so that the one of the first and the second tunnel barrier layers is between the first and the second ferromagnetic layers, and first and second electrodes coupled to another one of the pair of tunnel barrier layers and the second ferromagnetic layer, respectively.

In the present invention, the magnetic device may further comprise a current detector which detects variations in tunnel current. The tunnel current flows via the discrete energy level, and the variations in tunnel current are due to a change of magnetization direction of the first ferromagnetic layer or the second ferromagnetic layer.

In the present invention, the first ferromagnetic layer may have one or more grains in a nonmagnetic material.

In the present invention, the magnetic device may have spin polarization tunnel effect.

In the present invention, the second ferromagnetic layer may be merged with one of the second electrodes. In the present invention, the pair of tunnel barrier layers may be formed of dielectric material or semiconductor material.

In the present invention, the magnetic device may have spin dependent resonance tunnel effect.

In the present invention, a magnetization direction of one of the first and the second ferromagnetic layer may be fixed, and a magnetization of another of the first and the second ferromagnetic layer may be substantially rotatable.

In the present invention, the magnetic device may further comprise a third tunnel barrier layer, and a third ferromagnetic layer disposed adjacent to the third tunnel barrier layer so as to sandwich the third tunnel carrier layer with the first ferromagnetic layer.

In the present invention, the magnetic device may further comprise a third electrode coupled to the first ferromagnetic layer. In the present invention, the third electrode may control the discrete energy level. In the present invention, the magnetic device may have a current gain function.

In the present invention, the magnetic device may have 30% or more MR amplitude at room temperature, where the magnetoresistance amplitude is defined by $\Delta R/Rs$, where $\Delta R$ is resistance change of the device and Rs is a device resistance at saturation magnetization fields.

In a second aspect, the present invention may provide an integrated memory device comprising a plurality of word lines, a plurality of data lines, and a plurality of memory cells. Each of the memory cells is coupled to a corresponding one of the plurality of word lines and a corresponding one of the plurality of data lines. Each of the memory cells has first and second tunnel barrier layers, and a first ferromagnetic layer disposed between the first and the second tunnel barrier layers and having discrete energy level. Each memory cell also has a second ferromagnetic layer disposed adjacent to one of the first and the second tunnel barrier layers so that the one of the first and the second tunnel barrier layers is between the first and the second ferromagnetic layers. Each memory cell further has first and second electrodes coupled to another one of the first and the second tunnel barrier layers and the second ferromagnetic layer, respectively. Each of the plurality of data lines connects one of the first and second electrodes of a corresponding portion of the memory cells to a current detector for detecting variations in tunnel current flow via the discrete energy level in the first ferromagnetic layer. The variations in tunnel current are due to the change of magnetization direction of one of the first and the second ferromagnetic layers.

In the present invention, the integrated memory device may further comprise a conductive layer adjacent to one of the first and the second ferromagnetic layers via an insulator layer to provide current magnetic fields to one of the first and the second ferromagnetic layers.

In the present invention, the second ferromagnetic layer may be merged with one of the first and the second electrodes.

In a third aspect, the present invention provides a magnetic sensor comprising first and second tunnel barrier layers, a first ferromagnetic layer disposed between the first and the second tunnel barrier layers and having discrete energy levels. Second and third ferromagnetic layers are disposed adjacent to the first and the second tunnel barrier layers, respectively, so that the first and the second tunnel barrier layers are between the first ferromagnetic layer and the second and third ferromagnetic layers, respectively. A pair of electrodes is coupled to the first and the second tunnel barrier layers and the second ferromagnetic layer, and a current detector for detecting variations in tunnel current flow. The tunnel current flow is via the discrete energy level in the first ferromagnetic layer. The variations in tunnel current are due to the change of magnetization direction of one of the first and the second ferromagnetic layers.

In the present invention, the second ferromagnetic layer may be merged with one of the first and the second electrodes.

In the fourth aspect, the present invention may provide a magnetic head comprising first and second tunnel barrier layers, a first ferromagnetic layer disposed between the first and the second tunnel barrier layers and having discrete energy level. Second and third ferromagnetic layers are disposed adjacent to the first and second tunnel barrier layers so that the one of the pair of tunnel barrier layers is between the first and the second ferromagnetic layers. An antiferromagnetic layer is coupled to the third ferromagnetic layer.

In the present invention, the magnetic head may further comprise a current detector for detecting variations in tunnel current flow, the tunnel current flow being via the discrete energy level in the first ferromagnetic layer. The variations in tunnel current are due to the change of magnetization direction of one of the first and the second ferromagnetic layers.

In the present invention, the second ferromagnetic layer may be merged with one of the first and the second electrodes.

In a fifth aspect, the present invention may provide a magnetic disk system comprising a magnetic disk in which recorded information is sensed by a magnetic head. The magnetic head comprises first and second tunnel barrier layers, a first ferromagnetic layer disposed between the first and the second tunnel barrier layers and having discrete energy level, a second ferromagnetic layer disposed adjacent to one of the tunnel barrier layers so that the one of the first and the second tunnel barrier layers is between the first and the second ferromagnetic layers, and first and second electrodes coupled to another one of the first and second tunnel barrier layers and the second ferromagnetic layer. The magnetic disk system comprises a current detector for detecting variations in tunnel current flow, the tunnel current flow being via the discrete energy level in the first ferromagnetic layer. The variations in tunnel current are due to a change of magnetization direction of one of the first and the second ferromagnetic layers.

In the present invention, the second ferromagnetic layer may be merged with one of the first and the second electrodes.

The magnetic device according to the present invention can obtain 30% MR amplitude or more at room temperature broad variation of electric resistance. The MR amplitude of the device may maintain a high value even when current or voltage applied to the structure decreases. Therefore, the head and the magnetic disk system having the head can obtain a large output voltage or output current.

The magnetic device according to the present invention may exhibit current gain function.

The device of the present invention may be used as a magnetoresistance effect element, a magnetic sensor in magnetic disk system, a magnetic memory device, and a spin diode.

The spin diode may utilize negative resistance of the magnetic device of the present invention. The device of the present invention may be combined with a semiconductor device, such as a transistor, and may be used in a semiconductor integrated memory device.

The device or head according to the present invention may be provided with an underlayer of ferromagnetic or nonmagnetic layer and overcoat layer of ferromagnetic or nonmagnetic layer.

The device or head according to the present invention may be formed by Molecular Beam Epitaxy method, sputter methods, vapor methods.

The device or head according to the present invention may be provided on or above glass, ceramic, metal, single or polycrystal semiconductor substrate. Si substrate may preferably be used and integrated with the conventional semiconductor process technique.

BRIEF DESCRIPTION OF THE DRAWINGS

A more complete appreciation of the invention and many of the attendant advantages thereof is readily obtained as the same becomes better understood by reference to the following detailed description when considered in connection with the accompanying drawings.

DETAILED DESCRIPTION OF THE PREFERRED EMBODIMENTS

In various aspects, the present invention relates to a spin dependent conduction device which takes advantage of discrete energy levels in a ferromagnetic layer, controls the discrete energy level by applying voltage, and thus shows spin dependent conduction having high MR amplitude.

Figure 1:
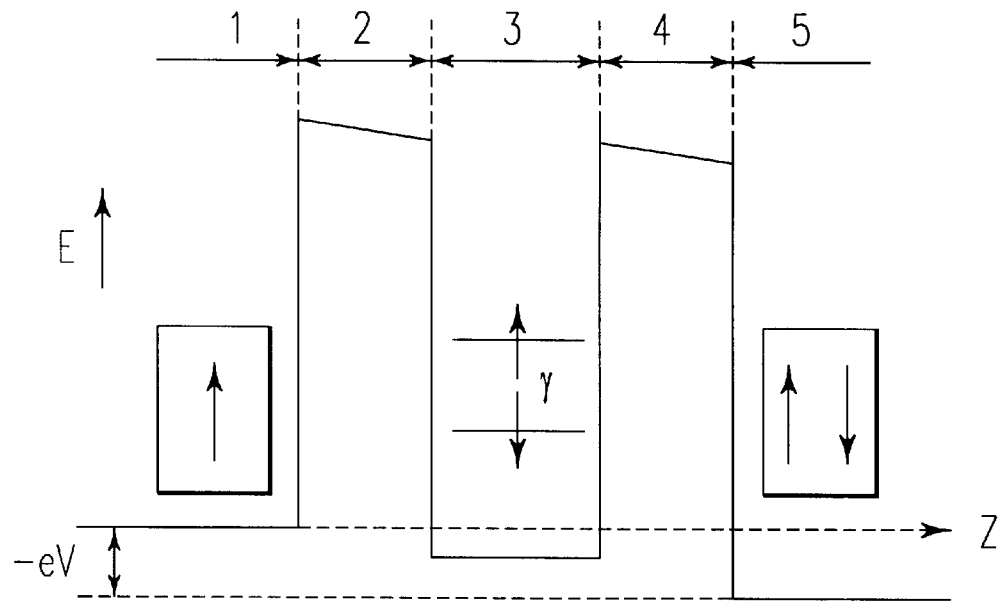
FIGS. 1 and 2 are schematic band diagrams at two ferromagnetic tunnel junctions of basic composition and schematic diagram of spin directions to describe the spin conduction mechanism utilized by the present invention.
Figure 2:
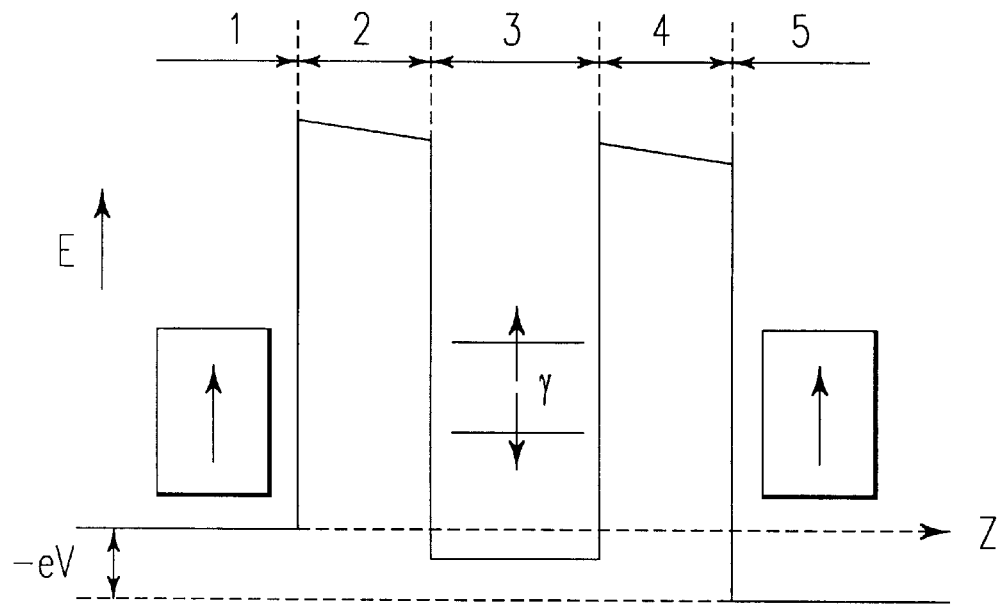

FIGS. 1 and 2 are schematic cross-sectional views showing band diagrams at double ferromagnetic tunnel junctions and spin directions to describe a mechanism used by the present invention.

The structure of the composition presented in FIG. 1 comprises a first ferromagnetic layer (a first metal layer) 1, a first dielectric layer 2, a second ferromagnetic layer 3, a second dielectric layer 4, and a third ferromagnetic layer (a second metal layer) 5. The structure has double ferromagnetic tunnel junctions.

The structure of the composition presented in FIG. 2 comprises a first ferromagnetic layer (a first metal layer) 1, a first dielectric layer 2, a second ferromagnetic layer 3, a second dielectric layer 4, and a nonmagnetic metal layer (second metal layer) 6, and also comprises double ferromagnetic tunnel junctions.

The thin second ferromagnetic layer 3 has discrete energy levels. Each of the discrete energy levels are spin split from each other by a quantum effect, and there is an energy gap γ between the levels of upspin (↑) and downspin (↓) respectively, as shown in FIG. 1. When spin directions of the first ferromagnetic layer 10 and the second ferromagnetic layer 3 and a voltage above a certain value are added to the double tunnel junctions, conduction via the discrete levels appears and resistance of the junctions decreases. The conduction is by a spin polarization tunnel effect. When the spin direction of one of the ferroelectric layers 1, 3 is reversed, the transmission factor becomes lower, and the resistance of the device becomes high. The device has a 30% MR amplitude at room temperature.

The resistance of the composition decreases when the applied voltage becomes larger than a certain threshold value, because of a spin dependent resonance tunnel effect. The tunnel current starts to flow between the first ferroelectric layer 1 and the third ferroelectric layer 5 at the applied voltage. One of the discrete levels of the second ferromagnetic layer 3 becomes the same as the energy level of the conduction electron of the first ferromagnetic layer 1, as a resonance state when voltage of above threshold value is applied. The conduction electrons of the first and the second metal layers 1, 5 are not reflected at the dielectric layers 2, 4 and tunnel through the two junctions to another of the first and the second metal layer 1, 5. As above described, a high MR amplitude based on the spin dependent resonance tunnel effect is obtained by controlling the discrete energy level of the second ferromagnetic layer 3.

The tunnel current flows based on the spin polarization tunnel effect are also obtained via the discrete energy level formed in a ferromagnetic granular layer. The granular layer has a grain or a plurality of grains in a nonmagnetic material. The grain size is small enough to have spin split discrete energy levels in itself. A 30% MR amplitude or more based on the spin polarization tunnel effect is obtained by using a granular layer at room temperature.

A first embodiment of the present invention is described with reference to the cross-sectional view depicted in FIG. 3.

Figure 3:
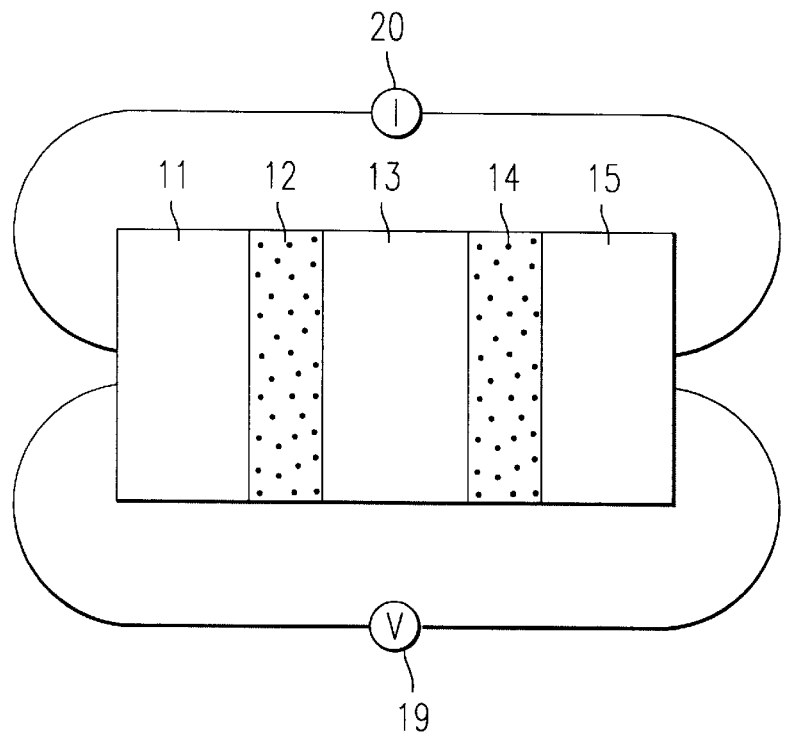
FIG. 3 is a schematic cross-sectional view showing a magnetic device according to a first embodiment of the present invention.

A magnetic device according to the first embodiment of the present invention comprises a first metal layer 11, a first tunnel barrier layer 12, a second ferromagnetic layer 13, a second tunnel barrier layer 14, and a second metal layer 15, as shown in FIG. 3. A voltage source 19 is coupled to the first and second metal layers 11 and 15, respectively, to a voltage applied across the magnetic device. A current detector 20 is coupled to the first and second metal layers 11 and 15, respectively, to detect a current flow through the magnetic device. The first and second tunnel barrier layers 12 and 14 may be formed of a dielectric, and are referred to hereinafter as first and second dielectric layers 12 and 14, respectively. The first metal layer 11 is a first electrode and has a ferromagnetic characteristic. The second metal layer 15 is a second electrode and may have either ferromagnetic or nonmagnetic characteristics. The ferromagnetic layer 13 is interposed between the thin dielectric layers 12, 14. The dielectric layer 12 is interposed between the ferromagnetic layer 13 and the first metal layer 11. The dielectric layer 14 is interposed between the ferromagnetic layer 13 and the second metal layer 15. A tunnel current flows at each of the following tunnel junctions, the first junction at the first metal layer I1, the first dielectric layer 12, and the second ferromagnetic layer 13, and the second junction at the second ferromagnetic layer 13, the second dielectric layer 14, and the second metal layer 15. The ferromagnetic layer 13 has a thickness that is sufficiently thin so that the discrete energy levels originated in the spin direction of the ferromagnetic layer 13 are formed by quantum effects. The discrete energy level E is controlled and the spin polarization tunnel effect raised by applying a voltage V across the first metal layer 11 and the second metal layer 15.

The ferromagnetic layer 13 may be substituted with either a plurality of ferromagnetic layers or a plurality of ferromagnetic layers with a dielectric layer interposed between each of the plurality of ferromagnetic layers to form threefold or more tunnel junctions. The structure in the latter case may comprise a first ferromagnetic layer 11, a first dielectric layer 12, a number N of sets of a ferromagnetic layer 13 and a dielectric layer and a second metal layer 15, where N is one or more.

The ferromagnetic material of the ferromagnetic layer 13 and the first metal layer 11 may be a Ni—Fe alloy (such as Permalloy), a ferromagnetic material (such as Fe, Co, Ni, an alloy thereof), a half-metal material (such as Heusler Alloy, namely NiMnSb, and PtMnSb), a perovskite oxide halfmetal (such as $CrO_2$, magnetite, Mn perovskite), and amorphous alloy. The above-mentioned element or an alloy may be grouped as soft magnetic material. A hard ferromagnetic material (such as CoPt alloy, FePt alloy, and an alloy comprising transition metal and rare earth metal) may be introduced as the ferromagnetic material of the ferromagnetic layer 13.

The spin direction (magnetization direction) of one of the group of first metal layer 11 and the ferromagnetic layer 13 may be reversed by using the difference between coercive forces of the ferromagnetic layers, or by disposing a bias layer (such as antiferromagnetic layer or hard magnetic layer) on one of the ferromagnetic layers so that the magnetization direction of one of the ferromagnetic layers is fixed by exchanging the coupling force or stray fields. The film thickness of the ferromagnetic layer 13 may be thin enough to have the discrete energy levels in the film. The thickness may be equal to or less than 10 nm, more preferably equal to or less than 5 nm and more than 0.1 nm. The film thickness of the first and the second metal layer 11, 15 may not be limited, but preferably is in the range from 0.1 nm to 100 mm.

Figure 4:
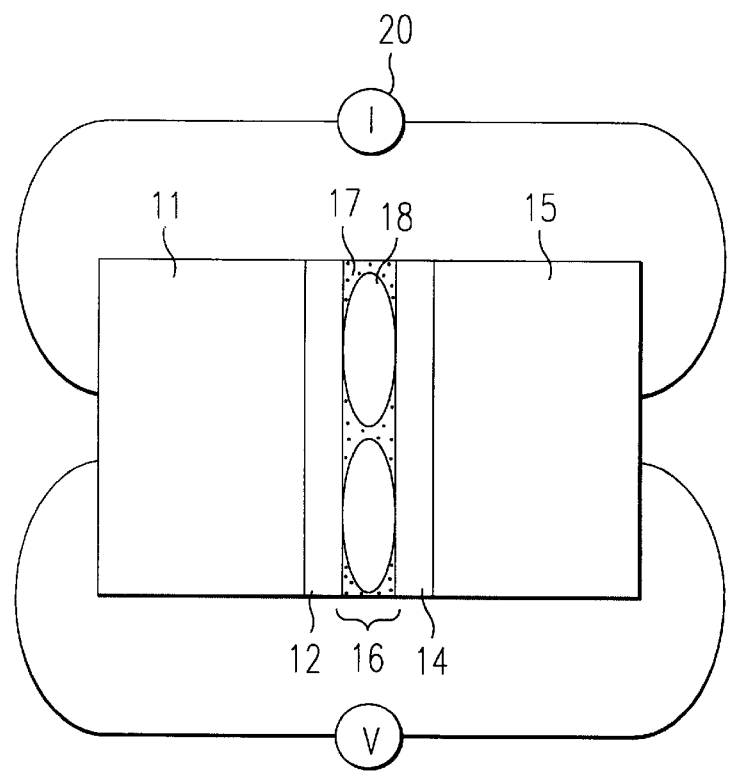
FIG. 4 is a schematic cross-sectional view showing a magnetic device having a granular layer according to a second embodiment of the present invention.

FIG. 4 shows a schematic cross-sectional view of a magnetic device having a granular layer according to a second embodiment of the present invention.

The magnetic device comprises a first metal layer 11, a first dielectric layer 12, a granular layer 16, a second dielectric layer 14, and a second metal layer 15. The first metal layer 11 may be formed of a ferromagnetic material. The second metal layer 15 may be formed of a ferromagnetic material or a nonmagnetic material. The granular layer 16 comprises a plurality of ferromagnetic grains 18 scattered in a dielectric material material 17. For simplicity, only two ferromagnetic grains 18 are shown in FIG. 4. Alternatively, the granular layer 16 may have one ferromagnetic grain 18.

The ferromagnetic grains do not have super-paramagnetism and have finite coercive force. The grain size of the ferromagnetic grains 18 may be different from each other. Preferably the grains are divided by the dielectric layers 12, 14 and have a small grain size.

A tunnel current flows at the two tunnel junctions of the device between the two electrodes 11, 15. One of the junctions is formed by the first metal layer 11, the first dielectric layer 12, and the ferromagnetic grains 18 in the layer 16. The other junction is formed by the ferromagnetic grains 18, the second dielectric layer 14, and the second metal layer 15.

The grain diameter of the ferromagnetic grain is sufficiently small that the energy levels of the ferromagnetic grains 18 are in quantization, and are dispersed and spin split. A spin polarization tunnel effect may be obtained by controlling the discrete energy levels. And the discrete levels may be controlled by applying a voltage between the first metal layer 11 and the second metal layer 15, as described in the first embodiment. A 30% or more MR amplitude is obtained by reversing the spin direction of either the ferromagnetic layer 11 or the plurality of ferromagnetic grains 18 at room temperature.

Figure 5:
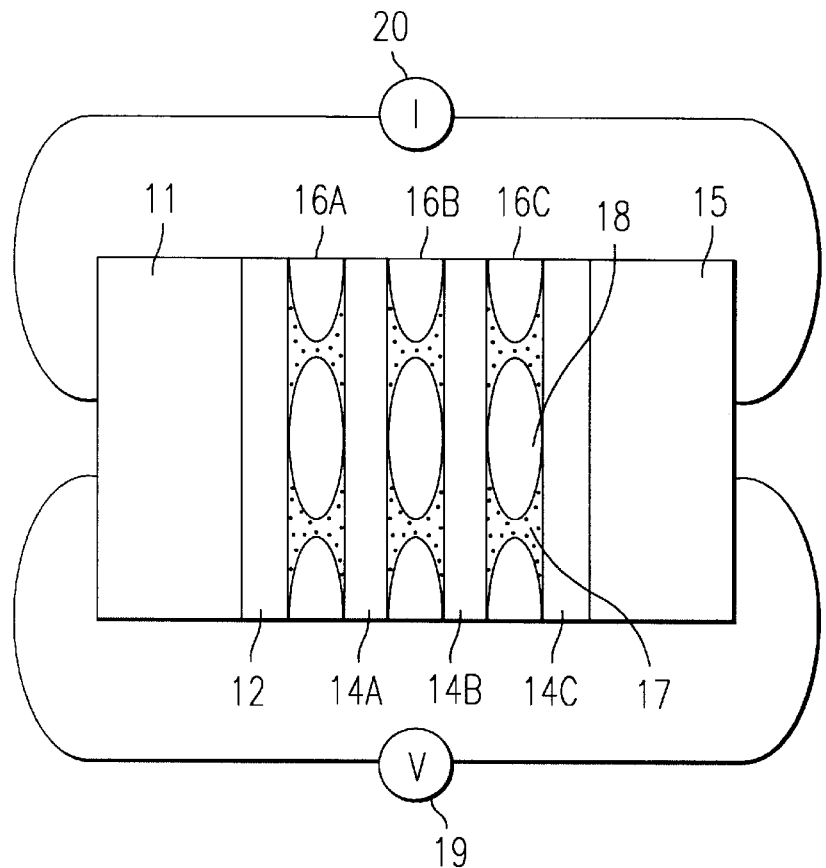
FIG. 5 is a schematic cross-sectional view showing a magnetic device having a multiple granular layer structure according to the second embodiment of the present invention.

FIG. 5 is a schematic cross-sectional view showing a magnetic device having a multiple granular layer structure according to the second embodiment of the present invention. The magnetic layer 16 may be substituted with a plurality of ferromagnetic layers 16a, 16b, 16c, and a plurality of dielectric layers 14a, 14b, 14c interposed between the magnetic layers, as shown in FIG. 5, so as to form multiple tunnel junctions. Each of the ferromagnetic layers 16a, 16b, 16c comprises ferromagnetic grains 18 scattered in the dielectric material material 17, as shown in FIG. 5.

Figure 6:
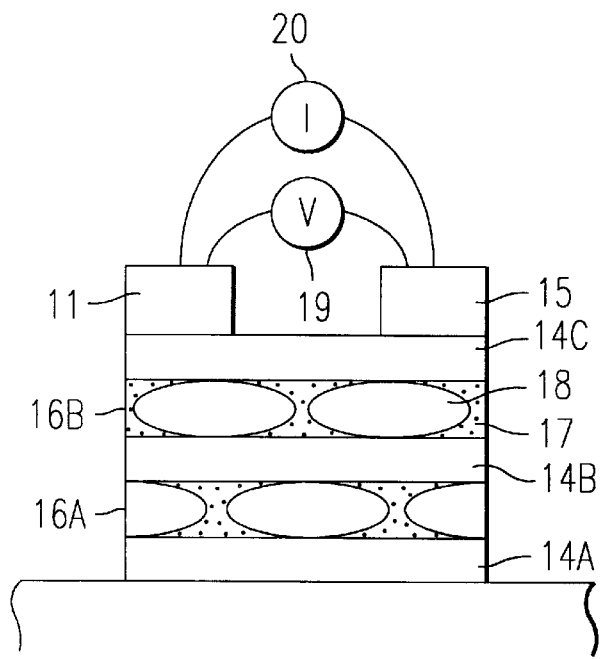
FIG. 6 is a schematic cross-sectional view showing another magnetic device having a multiple granular layer according to the second embodiment of the present invention.

FIG. 6 shows a schematic cross-sectional view of another magnetic device having a multiple granular layer structure according to a modification of the second embodiment of the present invention.

The modified device has a plane structure formed on a support and comprising a plurality of dielectric layers 14a, 14b, 14c, a plurality of ferromagnetic layers 16a, 16b and a plurality of electrodes 11, 15, as shown in FIG. 6. One of the electrodes 11, 15 comprises a ferromagnetic material, and another of the electrodes 11, 15 comprises a ferromagnetic or nonmagnetic metal. The plane magnetic device may be formed by fine pattern lithography. Each of the ferromagnetic layers 16a, 16b comprises ferromagnetic grains 18 scattered in a nonmagnetic material material 17.

The ferromagnetic grain 18 may comprise one of the magnetic materials having large magnetic anisotropy, such as CoPt alloy, Co, FePt alloy, and an alloy comprising transition metal or rare earth metal, to have a large anisotropic characteristic so that the ferromagnetic layer 16 has uniaxial magnetization. The grains may comprise one of the following so as to show a soft magnetic characteristic: Fe, Co, Ni, an alloy thereof, magnetite, an oxide magnetic material, or Heusler alloy. The oxide magnetic material may be one of the group consisting of $CrO_2$, $RXMn_{3-y}$ (R is a rare earth metal, X is at least one metal selected from the group consisting of Ba, Ca and Sr, and Y is numeral value near 0). The Heusler alloy may be either NiMnSb or PtMnSb.

An antiferromagnetic layer comprising material such as FeMn, PtMn, IrMn, PtCrMn, NiMo, and NiO may be used to fix the magnetization direction of the ferromagnetic layer 16. On the other hand, a variety of ferromagnetic materials for the layer 16 may be chosen when the antiferromagnetic layer or hard magnetic layer is disposed adjacent to the ferromagnetic layer. The magnetization direction may be unidirectionally fixed by bias magnetic fields produced by a hard ferromagnetic layer disposed on or adjacent to the ferromagnetic layer 16.

The dielectric layer 17 may comprise $Al_2O_3$, $SiO_2$, MgO, AlN, $Bi_2O_3$, $MgF_2$, and $CaF_2$. Oxide, fluoride, and nitride materials usually have natural element defects; however, the defects do not cause problems in the device function.

The ferromagnetic layer 11 may comprise nonmagnetic materials such as Ag, Cu, Au, Ta, B, C, Pd, Pt, Zr, Ir, W, Mo, or Nb, in a small enough quantity so that the layer 11 does not lose its ferromagnetic characteristic.

The first and second metal layers 11, 15 need not comprise the same material. These ferromagnetic layers may comprise a plurality of ferromagnetic layers with nonmagnetic layers interposed therebetween, and each of the ferromagnetic layers adjacent to each other may be coupled so as to have a magnetic antiparallel relation without having stray magnetic fields.

A stacked film which comprises a plurality of ferromagnetic layers and a plurality of semiconductor layers interposed between the ferromagnetic layers may be used as the first metal layer 11. The spin direction of the stacked film may be reversed by applying thermal annealing or light without applying a magnetic field.

The ferromagnetic layers 11, 16 preferably have uniaxial magnetic anisotropy in the film surface so as to obtain immediate reverse and retention of the magnetic state.

The film thickness of the ferromagnetic layers 16, the first metal layer 11, and the second metal layer 15 is preferably in the range from 0.1 to 200 nm. The film thickness of the ferromagnetic layer 16 is preferably as thin as possible, such as 10 nm or less. The film thickness of the dielectric layers 12, 14 are preferably in the range from 1 nm to several nm for determining the device characteristic and preferably 10 nm or less for production yield.

The film structure may be formed by a well-known thin film manufacturing method, such as molecular beam epitaxy (MBE), sputtering, and vacuum evaporation. The support may be a crystal or an amorphous phase. The support may comprise magnetic or nonmagnetic characteristics. The support may be formed of Si, $SiO_2$, $Al_2O_3$, spinel, MgO, or AlN.

Figure 7:
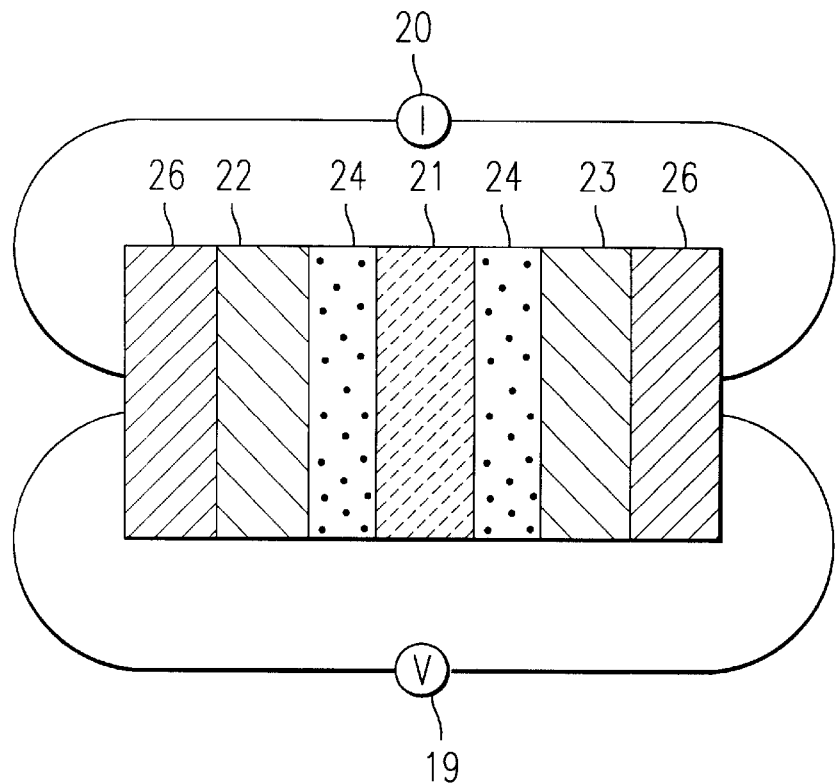
FIG. 7 is a schematic cross-sectional view showing a magnetic reproducing head according to a third embodiment of the present invention.

FIG. 7 is a schematic cross-sectional view of a magnetic head according to a third embodiment of the present invention.

The head comprises a stacked film having a first ferromagnetic layer 21, a second ferromagnetic layer (a first metal layer) 22, a third ferromagnetic layer (a second metal layer) 23, a dielectric layer 24, and a plurality of antiferromagnetic layers 26, as shown in FIG. 7. The first ferromagnetic layer 21 may have a substantially uniform composition, a plurality of ferromagnetic layers with nonmagnetic layers interposed between adjacent ferromagnetic layers, or ferromagnetic grains scattered in a nonmagnetic material material.

The antiferromagnetic layers 26 comprise FeMn, PtMn, IrMn, PtCrMn, NiMn, NiO, and $Fe_2O_3$ and are disposed on the second ferromagnetic layer 21 and the third ferromagnetic layer 23 so as to provide exchange bias fields to each of the responding ferromagnetic layers 21, 23, as shown in FIG. 7. Alternatively, the ferromagnetic layer 21 may be formed of a soft ferromagnetic material and the second and third ferromagnetic layers 22, 23 may be formed of a hard magnetic material.

Figure 8:
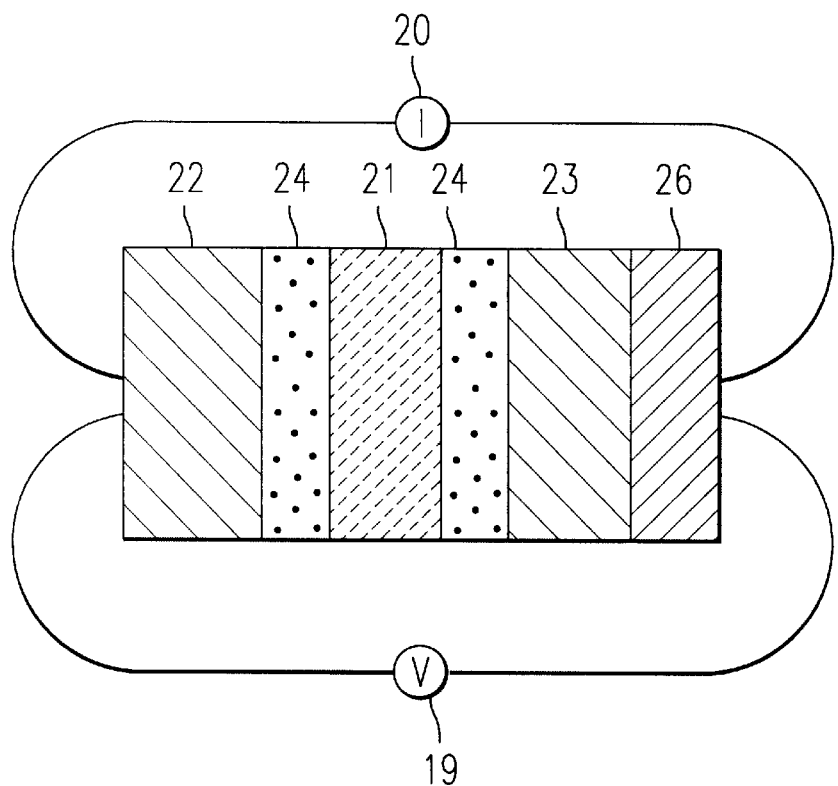
FIG. 8 is a schematic cross-sectional view showing a modified magnetic reproducing head according to the third embodiment of the present invention.

FIG. 8 is a schematic cross-sectional view of a modified magnetic head of the third embodiment of the present invention.

A ferromagnetic layer 22 comprises soft magnetic material so as to have a coercive force difference from a ferromagnetic layer 23, as shown in FIG. 8. In contrast to the magnetic head of FIG. 7, the magnetic head of FIG. 8 lacks an antiferromagnetic layer 26 disposed on the first magnetic layer 22. The ferromagnetic layers 21, 23 may comprise a hard magnetic material and have a hard magnetic characteristic.

Figure 9:
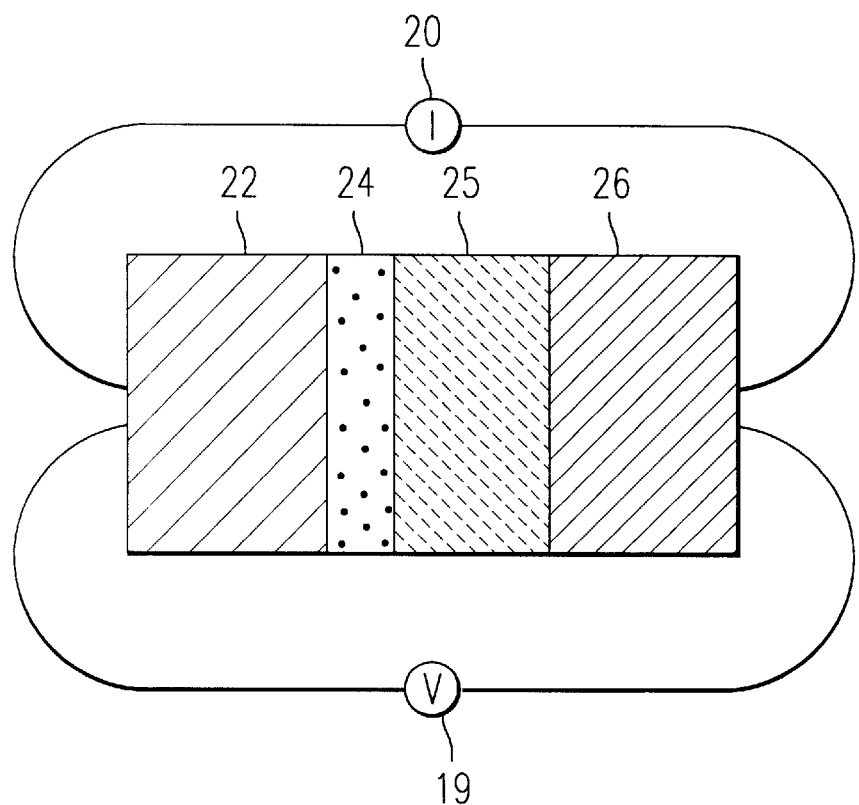
FIG. 9 is a schematic cross-sectional view showing another modified reproducing head according to the third embodiment of the present invention.

FIG. 9 is a schematic cross-sectional view of another modified head of the third embodiment of the present invention.

A ferromagnetic layer 22 may have a soft ferromagnetic characteristic. A ferromagnetic layer 25 comprises a plurality of ferromagnetic layers (not shown) and a plurality of dielectric layers (tunnel barrier layers) (not shown). Each dielectric layer is interposed between the plurality of the ferromagnetic layers so as to separate adjacent ferromagnetic layers. The ferromagnetic layer 25 may have a hard magnetic characteristic.

Spin directions of each of the adjacent ferromagnetic layers of the magnetic heads shown in FIGS. 7, 8, and 9 may be substantially perpendicular so as to obtain a linear response to the magnetic recording medium. The spin directions of the ferromagnetic layers adjacent to each other may be provided by heat annealing in magnetic fields and/or deposition in magnetic fields.

FIGS. 10, 11, 12, 13, and 14 are cross-sectional views showing magnetic memory devices according to a fourth embodiment of the present invention.

Figure 10:
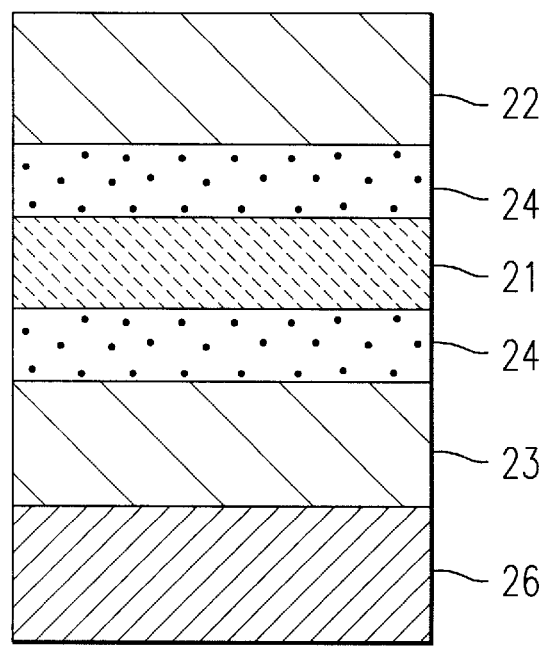
FIG. 10 is a schematic cross-sectional view showing a magnetic memory device according to a fourth embodiment of the present invention.
Figure 11:
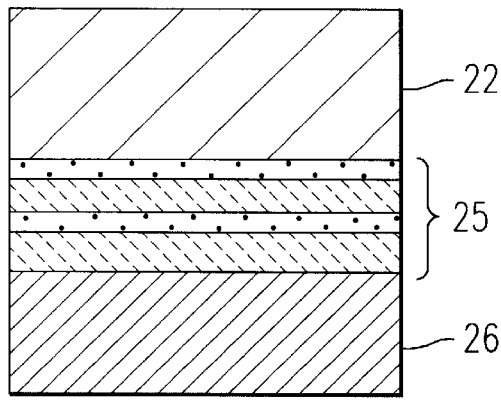
FIG. 11 is a schematic cross-sectional view showing a first modified magnetic memory device according to the fourth embodiment of the present invention.

FIGS. 10 and 11 show magnetic memory devices of destructive read out. Antiferromagnetic layers 26 may be disposed on the ferromagnetic layers 23, 25, as shown in FIGS. 10, 11, and may comprise the above-described materials of the third embodiment of the present invention. The ferromagnetic layer 25 may comprise a plurality of ferromagnetic layers each separated from an adjacent ferromagnetic layer by a nonmagnetic layer, as shown in FIG. 11. An antiferromagnetic layer may be applied to the ferromagnetic layers 21, 22 to provide fixed magnetization.

The ferromagnetic layer 22 of FIG. 10 may have a soft magnetic characteristic. The ferromagnetic layer 21 and the ferromagnetic layer 23 in FIG. 10 may have a hard magnetic characteristic.

The ferromagnetic layer 22 of FIG. 11 may have a soft magnetic characteristic. The multilayer 25 of FIG. 11 may have a hard magnetic characteristic.

Figure 12:
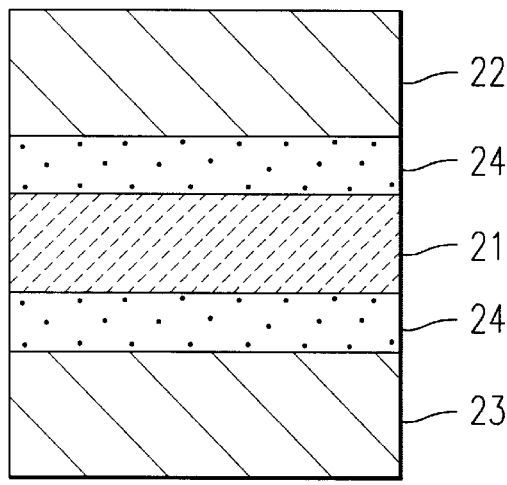
FIG. 12 is a schematic cross-sectional view showing a second modified magnetic memory device according to the fourth embodiment of the present invention.
Figure 13:
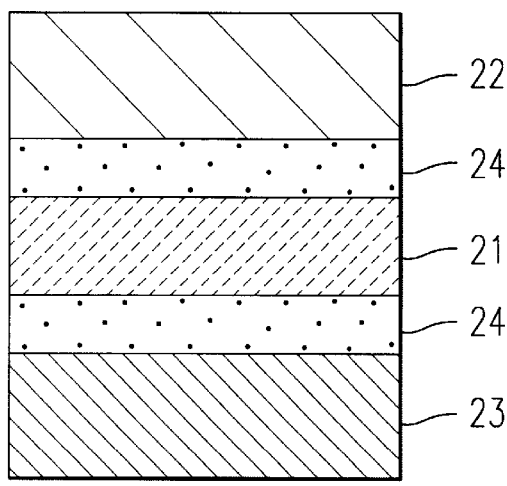
FIG. 13 is a schematic cross-sectional view showing a third modified magnetic memory device according to the fourth embodiment of the present invention.

FIGS. 12 and 13 show magnetic memory devices of nondestructive read out. The devices may comprise a soft magnetic layer to record magnetic information and a hard magnetic layer to write information. Information written in the soft magnetic layer may be read out by reversing the magnetization direction of the soft magnetic layer without destruction of the written magnetic information.

The ferromagnetic layers 22 of FIG. 11 may have a soft magnetic characteristic and the ferromagnetic layers 21, 23 of FIG. 11 may have a hard magnetic characteristic. The ferromagnetic layer 21 may have a hard magnetic characteristic, and the second metal layer 27 may comprise nonmagnetic metal.

Figure 14:
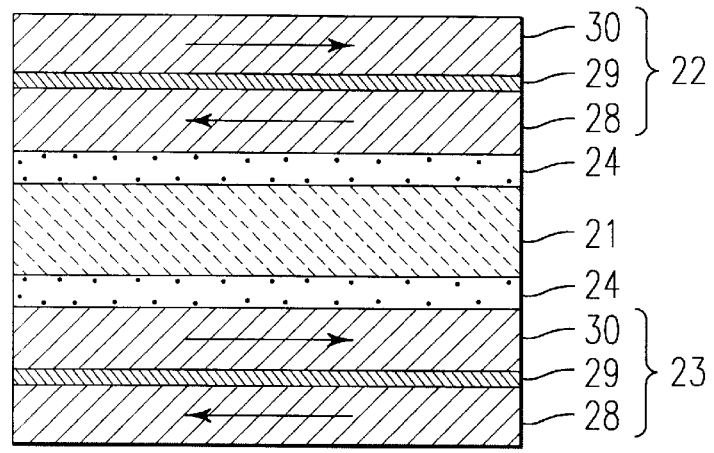
FIG. 14 is a schematic cross-sectional view showing a fourth modified magnetic memory device according to the fourth embodiment of the present invention.

A stacked film comprises a magnetic layer 28, a nonmagnetic layer 29, and a magnetic layer 30 which may be used as the ferromagnetic layers 21, 23, as shown in FIG. 14. A semiconductor layer may be used as the nonmagnetic layer, and a spin switch (reversing the spin direction) may be performed by applying light to the magnetic layer.

Figure 15:
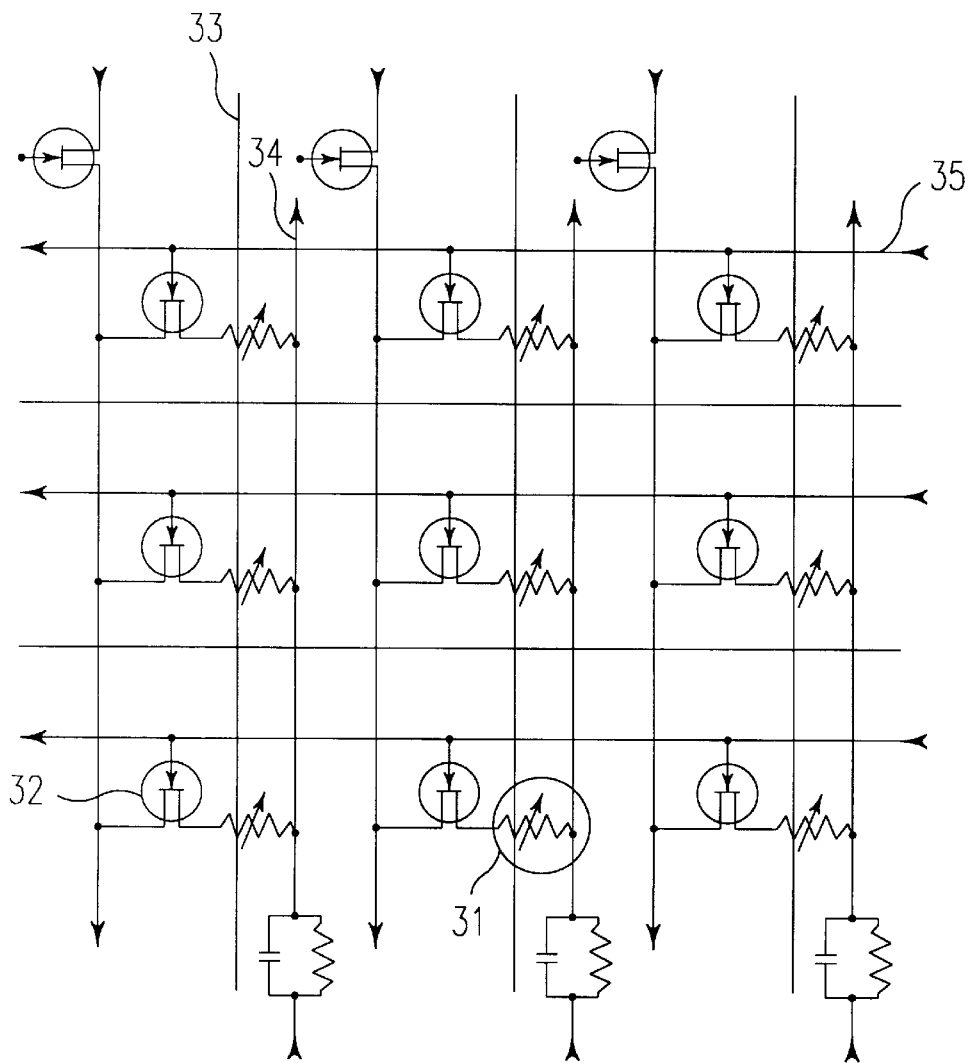
FIG. 15 is a circuit diagram showing an integrated magnetic memory device comprising a plurality of magnetic memory devices according to the fourth embodiment of the present invention.

FIG. 15 shows a magnetic memory cell matrix of an integrated memory device according to the fourth embodiment of the present invention. The integrated memory device comprises a plurality of memory devices 31, a plurality of transistors 32, a plurality of data lines 33, a plurality of bit lines 34, and a plurality of word lines 35. Each of the plurality of memory devices 31 comprises one of the above-described magnetic memory devices. The plurality of memory devices 31 is arranged in a memory cell matrix. Each of the plurality of memory devices 31 is coupled to a corresponding one of the plurality of transistors 32 and to a corresponding one of the plurality of bit lines 34. Each of the plurality of word lines 35 is coupled to a row of transistors 32. The memory devices 31, the plurality of transistors 32, the plurality of Word Lines (WL) 35, the plurality of Data Lines (DL) 33, and the plurality of Bit Lines (BL) 34 are formed with fine pattern lithography on a substrate.

Figure 16:
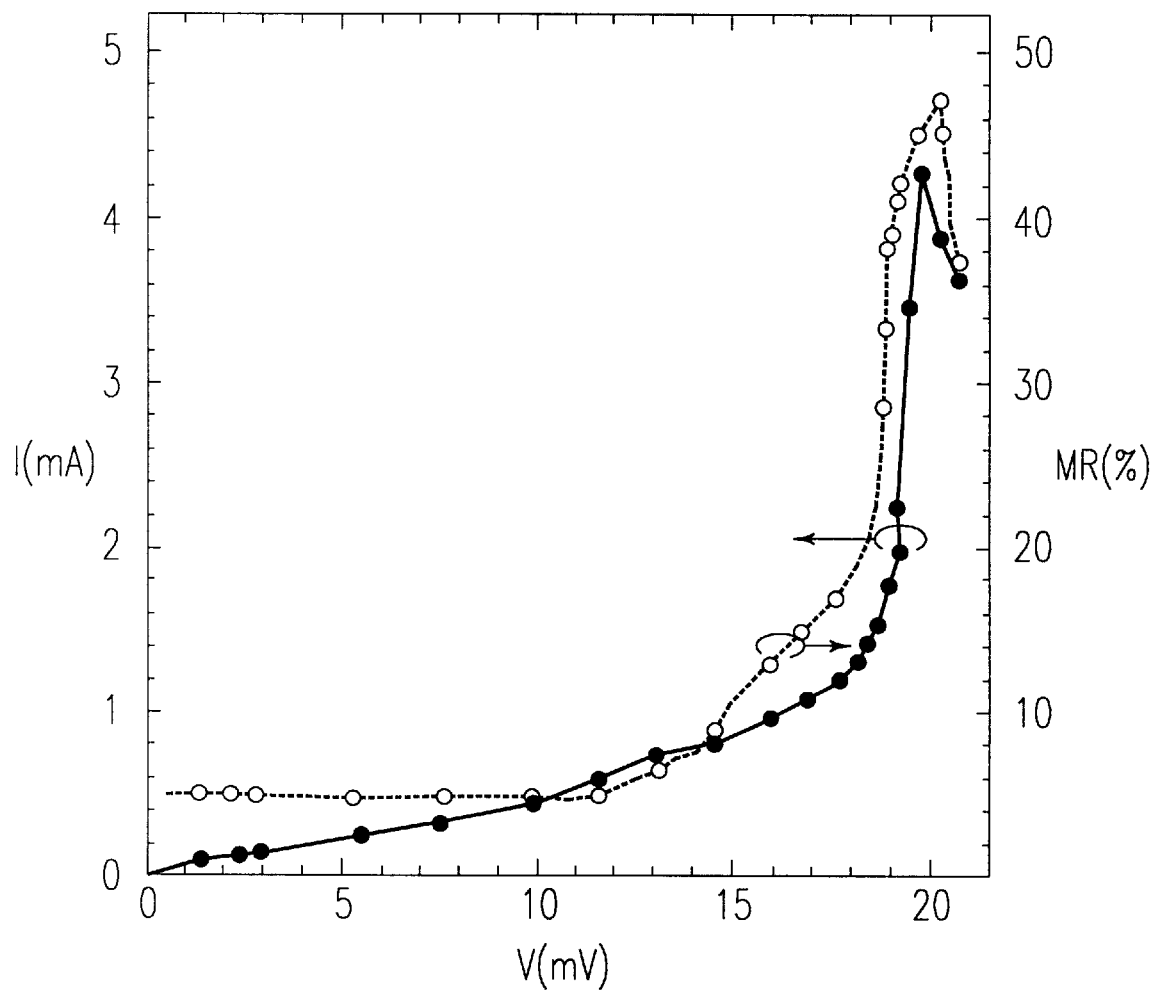
FIG. 16 is graph illustrating experimental data of voltage-current characteristic and voltage-magnetoresistance (MR) characteristic of a magnetic device according to a fifth embodiment of the present invention.

FIG. 16 is a graph showing measurement results of a voltage (mV)-current (I) (mA) characteristic and a voltage (mV)-magnetoresistance (MR) (%) characteristic of a magnetic device according to a fifth embodiment of the present invention.

The magnetic head of the fifth embodiment has a stacked film comprising the first metal layer 11 (which includes a first Au layer, a Fe layer, a first CoFePt layer), the first tunnel barrier layer 12 (which includes a first $Al_2O_3$ layer), the second ferromagnetic layer 13 (which includes a second CoFePt layer), the second tunnel barrier layer 14 (which includes a second $Al_2O_3$ layer), and the second metal layer 15 (which includes a $Co_9Fe$ layer, and a second Au layer) as shown in FIG. 3. The stacked film may be formed by the following steps.

The first Au layer having a thickness of 200 nm, the Fe layer having a thickness of 50 nm, and the first CoFePt layer having a thickness of 0.5 nm are formed as an electrode on a Si substrate main surface which is covered with the first $Al_2O_3$ layer in magnetic fields to provide uniaxial anisotropy to the Fe and the first CoFePt layers. Those layers are formed in a sputtering device using tree targets. Each sputter target for forming each Fe layer, CoFePt layer, and Al layer may comprise Fe, $Co_5Fe_3Pt_2$, and Al and is used at $1\times10^{-3}$ Torr Ar gas pressure. A metal mask is used for the electrode forming and the surface of the 1 nm Al layer formed on the electrode is plasma oxidized after exchanging the metal mask in vacuum.

The second CoFePt layer has a thickness of 2 nm and is formed on the first $Al_2O_3$ layer, and the second $Al_2O_3$ layer is formed on the second CoFePt layer by depositing the Al layer on the second CoFePt layer and plasma oxidizing the Al layer surface.

Another electrode comprising the $Co_9Fe$ layer, which has a thickness of 40 nm, and the second Au layer, which has a thickness of 200 nm, is formed on the second $Al_2O_3$ layer using a negative resist layer as an interlayer insulator.

Two tunnel junctions are provided at the interfaces comprising the first CoFePt layer/the first $Al_2O_3$ layer/the second CoFePt layer and the second CoFePt layer/the second $Al_2O_3$ layer/the $CO_9Fe$ layer.

The Kerr effect of the stacked film measurement result shows two steps magnetic hysteresis originates in coercive force differences between CoFePt of relatively large coercive force and Fe/CoFePt plus $Co_9Fe$ of relatively small coercive force.

The resistance of the device decreases and the MR amplitude increases when the applied voltage increases and become larger than a certain threshold voltage. This behavior originates in spin dependent tunnel effect. The tunnel conduction is via quantum effect discrete energy levels formed in the CoFePt layers.

Figure 17:
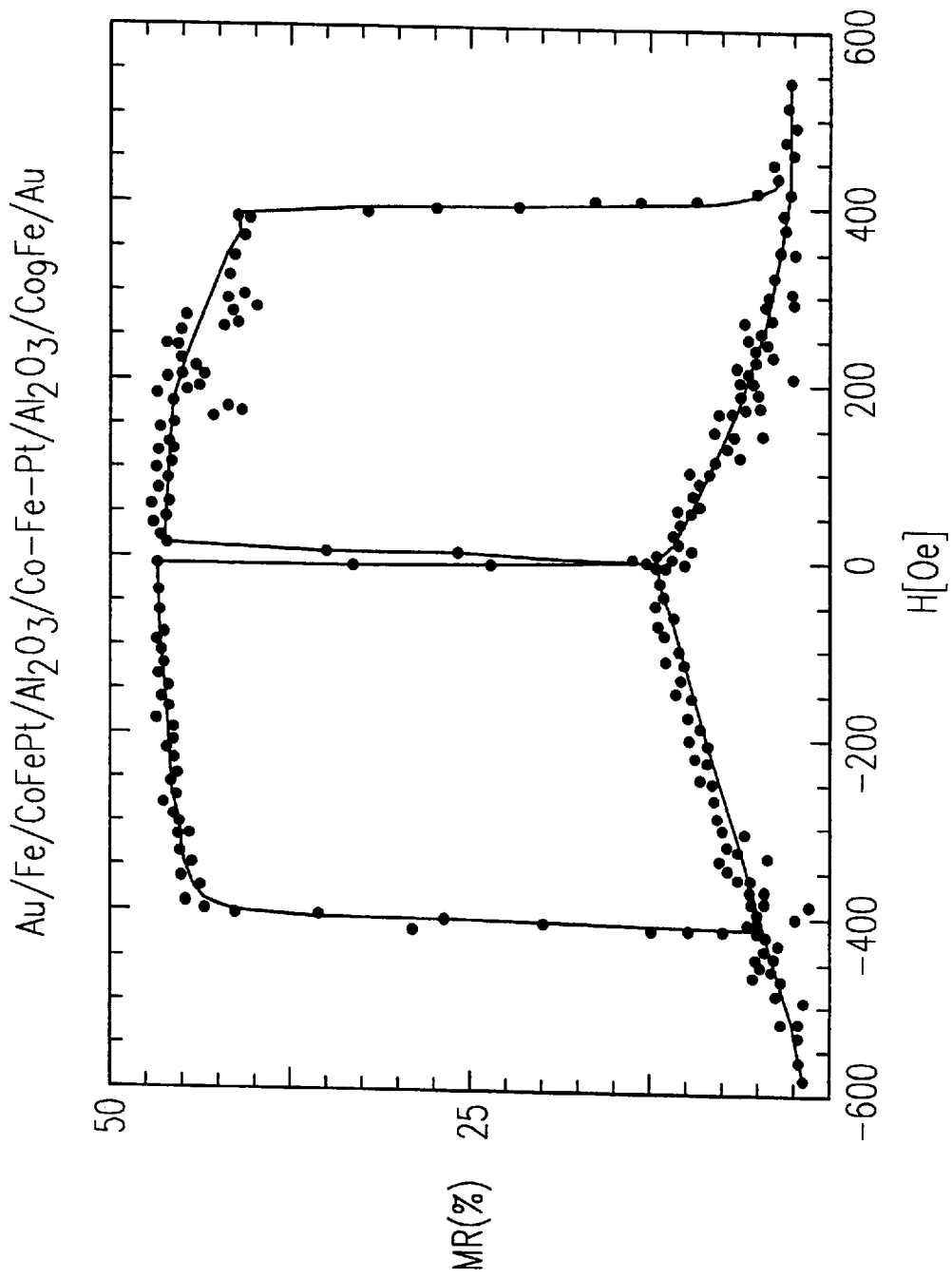
FIG. 17 is a graph illustrating experimental data of magnetic field-magnetoresistance characteristic of the magnetic device of FIG. 16 according to the fifth embodiment of the present invention.

FIG. 17 is a graph illustrating experimental data of a magnetic field-magnetoresistance characteristic of the magnetic device of FIG. 16 according to the fifth embodiment of the present invention. The MR amplitude characteristic shown in FIG. 17 indicates that the amplitude of Fe and $Co_9Fe$ show a steep change and a preferable characteristic as a magnetoresistance effect head, a magnetic sensor, and a magnetic memory device.

Figure 18:
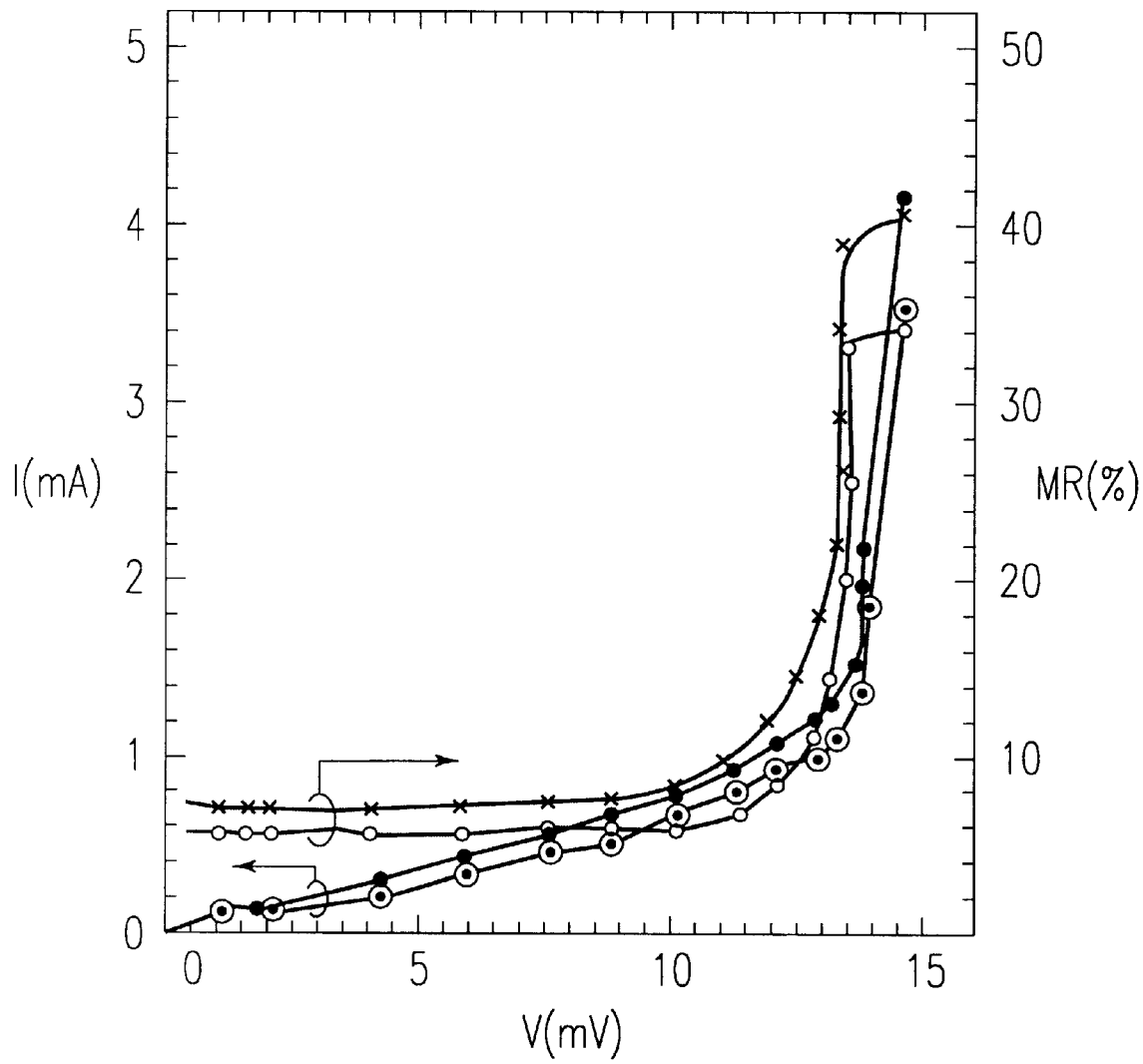
FIG. 18 is a graph illustrating experimental data of a voltage-current characteristic and a voltage-magnetoresistance characteristic of a magnetic device according to a sixth embodiment of the present invention.
Figure 19:
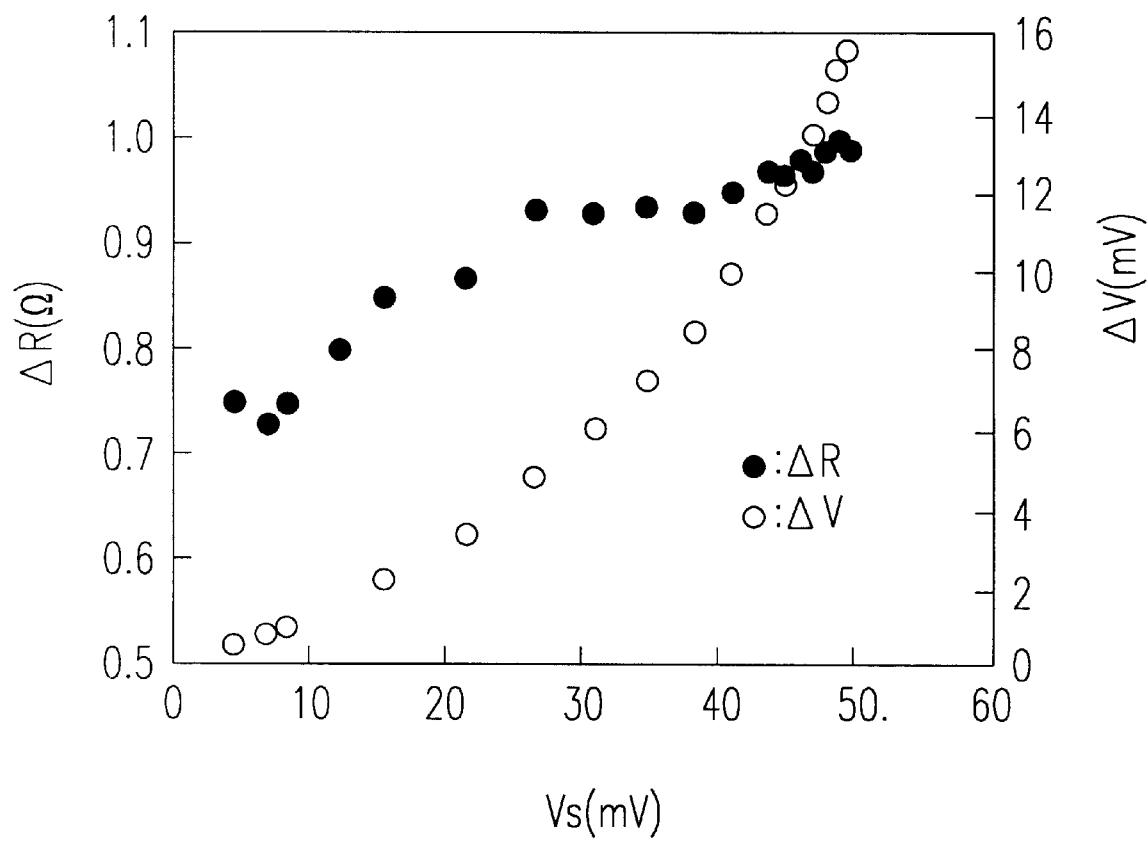
FIG. 19 is a graph illustrating experimental data of a voltage-change in resistance characteristic and voltage-change of voltage characteristic of the magnetic device of FIG. 18 according to the sixth embodiment of the present invention.
Figure 20:
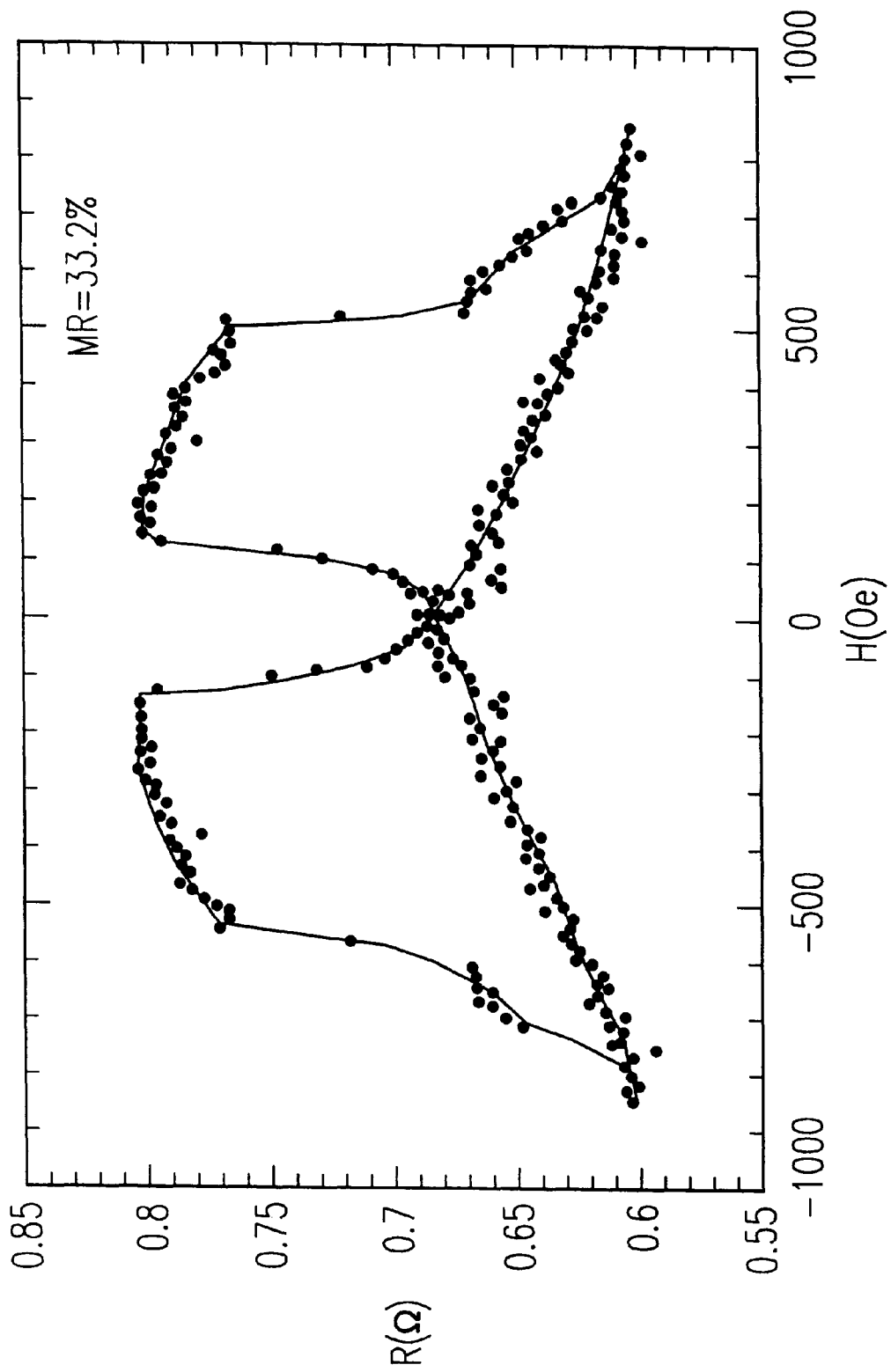
FIG. 20 is a graph illustrating experimental data of a magnetic field-resistance characteristic of the magnetic device of FIG. 18 according to the sixth embodiment of the present invention.

FIG. 18 is a graph showing a current (I) (mA)-voltage (mV) characteristic and magnetoresistance (MR) (%)-voltage (mV) characteristic of a magnetic device according to a sixth embodiment of the present invention. When the applied voltage increases above a threshold voltage, the resistance of the device decreases and the MR amplitude increases by a spin dependent tunnel effect. FIG. 19 shows $\Delta R$, which is the resistance difference between two states that two spin directions are parallel or antiparallel increases with the applied voltage Vs increase. This result may be used to obtain a magnetic device of large MR amplitude and low resistance as shown in FIG. 20, a diagram of magnetic field $\{H(G)\}$-resistance $\{R(\Omega)\}$.

The magnetic device of the present embodiment comprises a first metal layer 11 (which includes a first Au layer/a first Fe layer/a first $Co_8Pt_2$ layer), a first dielectric layer 12 (which includes a first $SiO_2$ layer), a granular layer 16 (which includes a second $Co_8Pt_2$ layer/a $SiO_2$ material layer having $Co_8Pt_2$ grains in its layer), a second dielectric layer 14 (which includes a second $SiO_2$ layer), and a second metal layer 15 (which includes a third $Co_8Pt_2$ layer/a $Co_9Fe$ layer/a second Au layer), and also includes two tunnel junctions, as shown in FIG. 4, and has 100×100 square micron area. The structure is formed by the following steps.

The first Au layer (which preferably has a thickness of 200 nm), the first Fe layer (which preferably has a thickness of 40 nm), and the first $Co_8Pt_2$ layer (which preferably has a thickness of 10 nm) are formed on a main surface of a thermal oxidized Si substrate using a metal mask in a sputtering device. These layers are formed in a $1\times10^{-3}$ Torr As gas atmosphere and formed in a magnetic field to give uniaxial anisotropy. The second $Co_8Pt_2$ layer and the $SiO_2$ layers are alternately formed by sputtering using $Co_8Pt_2$ and $SiO_2$ targets so as to obtain equal volumes of the $Co_8Pt_2$ and $SiO_2$ and to form the $Co_8Pt_2$ grains in the $SiO_2$ material. During these steps, the substrate is provided with a 400 W bias power.

Figure 21:
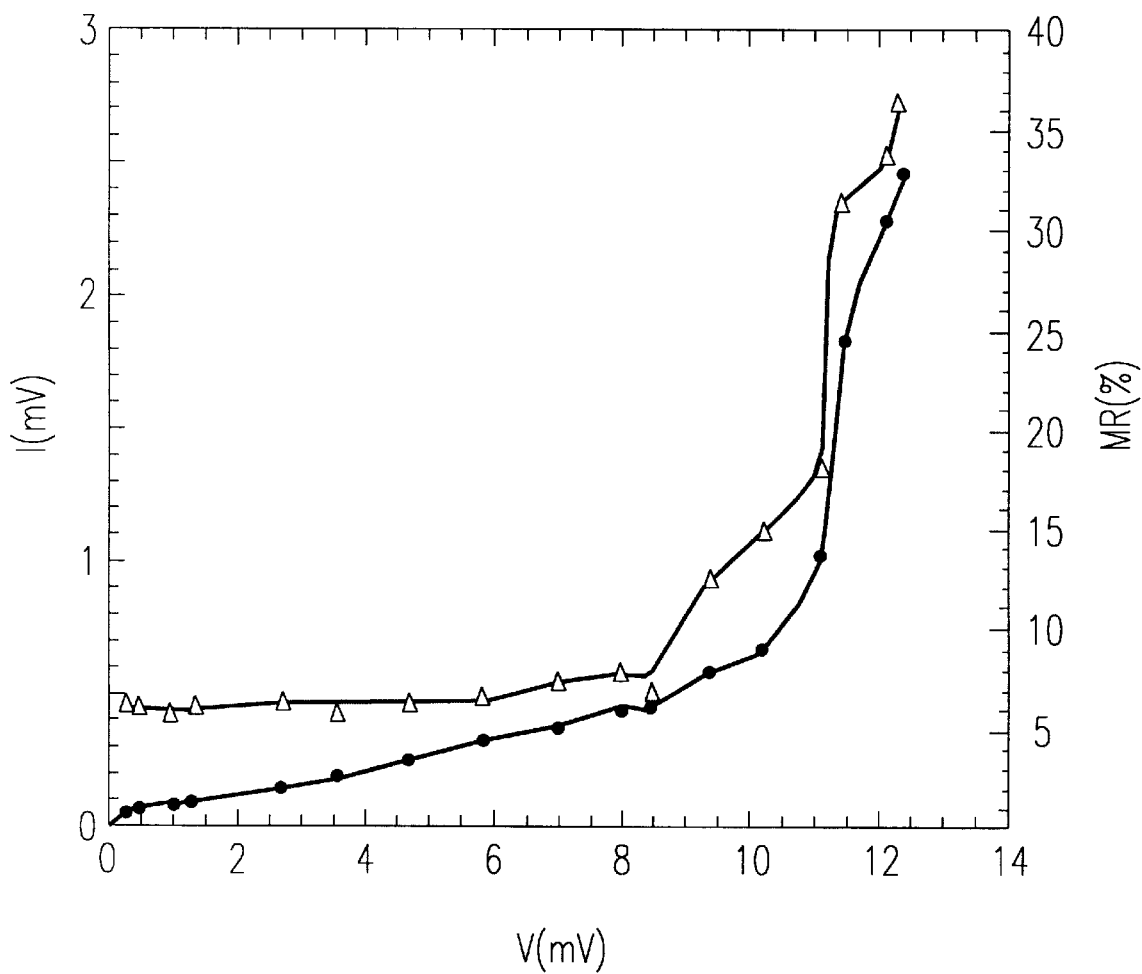
FIG. 21 is a graph illustrating experimental data of a voltage-current characteristic and a voltage-magnetoresistance characteristic of a magnetic device according to a seventh embodiment of the present invention.

The 1 nm $SiO_2$ layer is formed of the stacked film and then the metal mask is exchanged. The third $Co_8Pt_2$ layer (which preferably has a thickness of 20.5 nm), the $Co_9Fe$ layer (which preferably has a thickness of 40 nm), and the second Au layer (which preferably has a thickness of 200 nm) are formed in this order FIG. 21 shows a voltage (mV)-current (mV) and voltage (mV)-magnetoresistance (%) characteristic of a magnetic device of a seventh embodiment. The spin dependent conductive effect appears by applying voltage to the device, as shown in FIG. 21. The device of this embodiment has a structure shown in FIG. 6 and is formed using a metal mask and lift-off so as to shape the plane stacked structure. The device comprises a first dielectric layer 14a (which includes a first $SiO_2$ layer), a first ferromagnetic layer 16a (which comprises $Co_8Pt_2$ ferromagnetic grains 18 and a $SiO_2$ material 17), a second dielectric layer 14b (which includes a second $SiO_2$ layer), a second ferromagnetic layer 16b (which includes $Co_8Pt_2$ ferromagnetic grains 18 in a $SiO_2$ material 17), a third dielectric layer 14c (which includes a third $SiO_2$ layer), and electrodes 11, 15 (which includes a $Co_8Fe_2$ layer and a $Ni_8Fe_2$ layer). The structure is $SiO_2$/two (ferromagnetic layer/$SiO_2$) and is formed by the following steps.

A ferromagnetic layer comprising $Co_8Pt_2$ grains in a $SiO_2$ material is formed on a main surface of a thermal oxidized Si substrate by sputtering using $Co_8Pt_2$ and $SiO_2$ targets and the ferromagnetic layer is formed in a manner to obtain the same volumes of both the $Co_8Pt_2$ and $SiO_2$. Ar gas pressure is $1\times10^{-3}$ Torr during formation of the layers.

A resist used for the lift-off process is formed by a Cr mask exposure device and the $Co_8Fe_2$ layer and $Ni_8Fe_2$ layers are formed on the ferromagnetic layer. After these are formed, the stacked structure is annealed in magnetic fields at 200° C. to apply uniaxial magnetic anisotropy.

Figure 22:
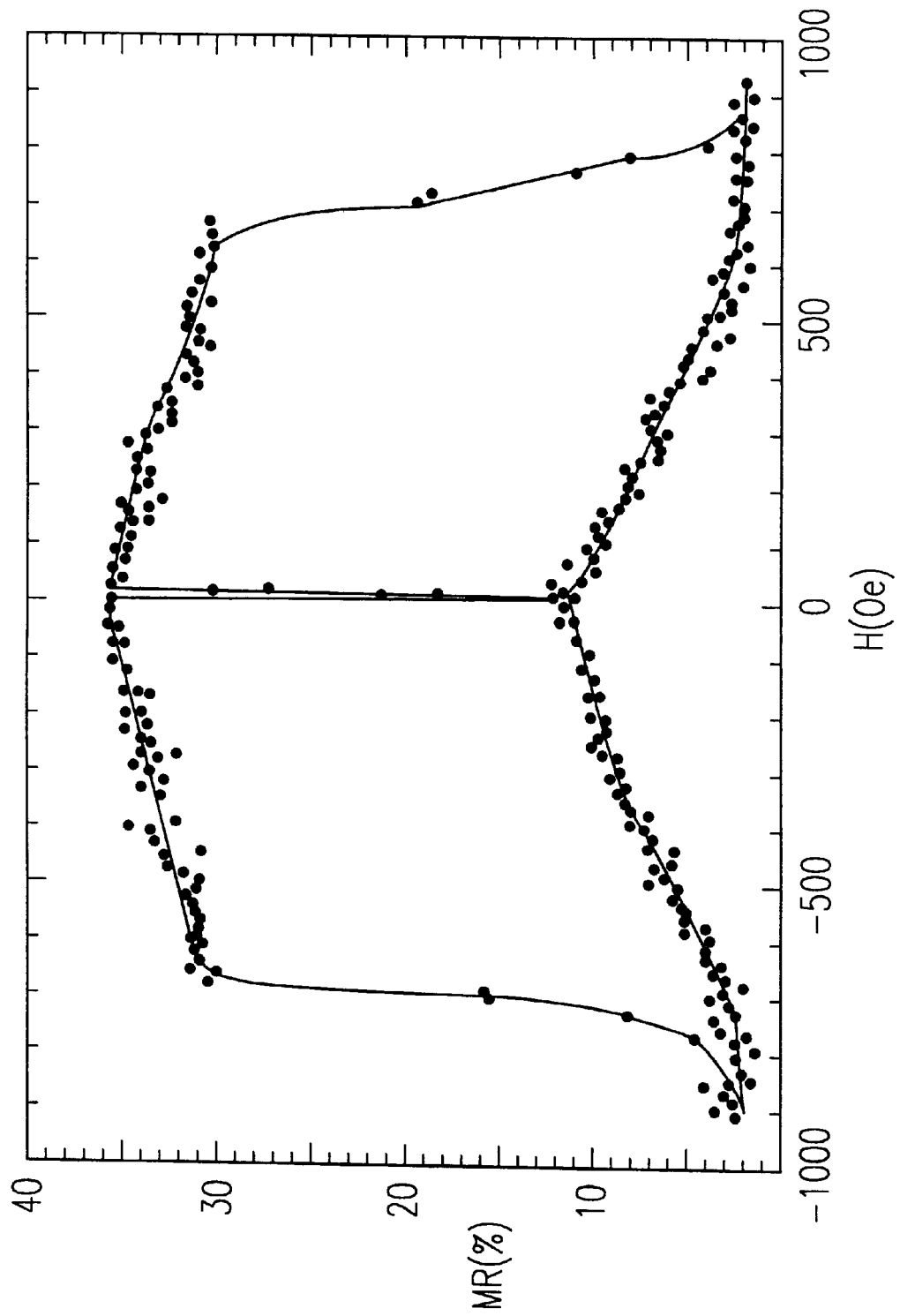
FIG. 22 is a graph illustrating experimental data of magnetic field-magnetoresistance characteristic of the magnetic device of FIG. 21 according to the seventh embodiment of the present invention.

The MR amplitude of the device shows a steep change at the magnetic fields H of 6 (Oe) as shown in FIG. 22.

Figure 23:
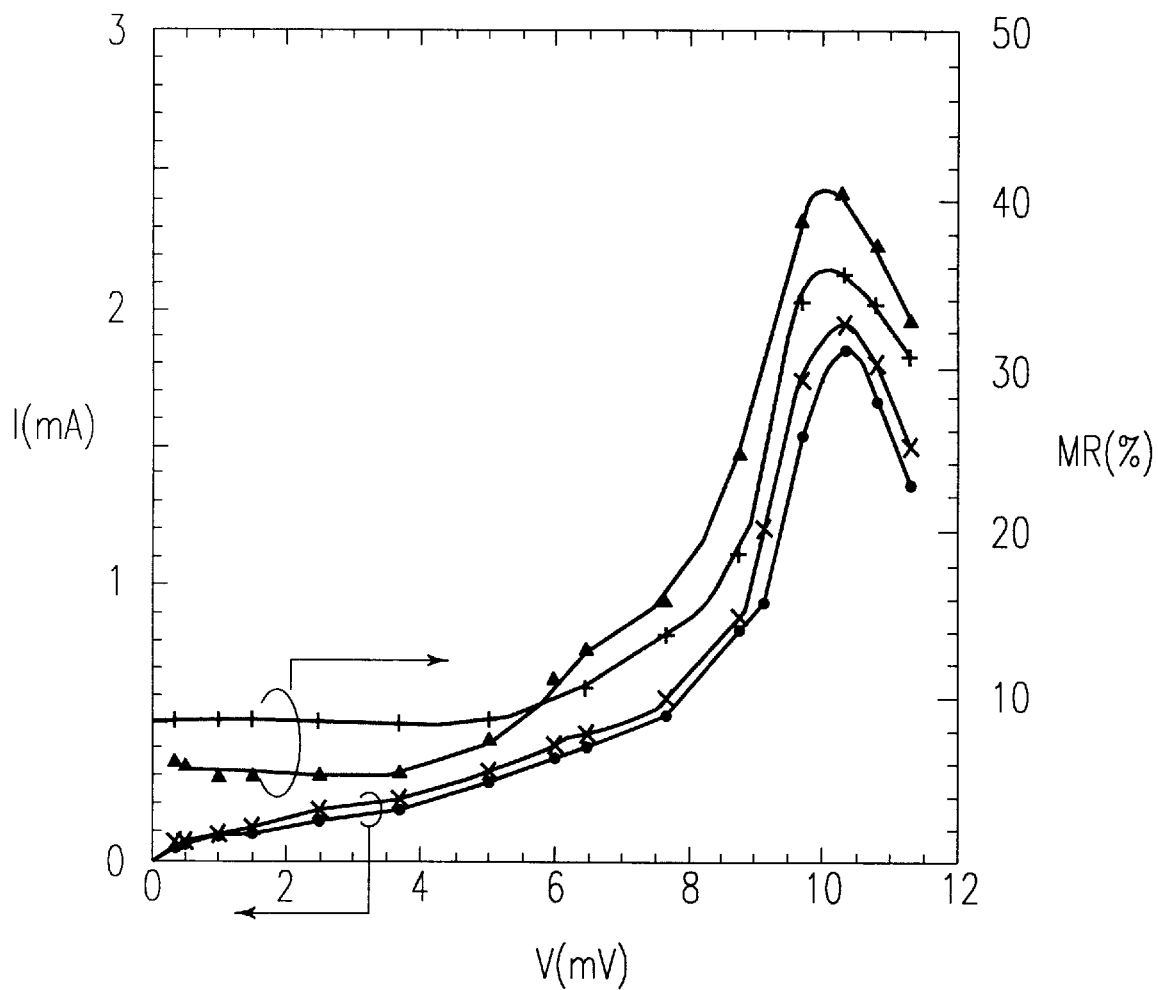
FIG. 23 is a graph illustrating experimental data of a voltage-current characteristic and a voltage-magnetoresistance characteristic of the magnetic device according to an eighth embodiment of the present invention.

FIG. 23 shows voltage (V) (mV)-current (I) (MA) and voltage (mV)-magnetoresistance (%) characteristic of a magnetic device according to an eighth embodiment of the present invention. The device has triple tunnel junctions and has the same film structure as shown in FIG. 8. The antiferromagnetic layer 26 comprises a first Au layer and a IrMn layer. The third ferromagnetic layer 23 comprises a first $Co_9Fe$ layer and a first $Al_2O_3$ layer having a plurality of $Co_8Pd_2$ grains. The dielectric layer 24 comprises a second $Al_2O_3$ layer. The second dielectric layer 24 comprises a $Al_2O_3$ layer. The first ferromagnetic layer 21 comprises a $Co_8Pd_2$ layer. The second dielectric layer 24 comprises third $Al_2O_3$ layer. The first metal layer 22 comprises a third $Co_8Pd_2$ layer, a second $Co_9Fe$ layer, a NiFe layer, and a second Au layer. The structure of this embodiment is formed by the following steps.

The first Au layer (preferably having a thickness of 200 nm), the Ir—Mn layer (preferably having a thickness of 15 nm), and the first $Co_9Fe$ layer (preferably having a thickness of 20 nm) are formed in this order on a main surface of a thermal oxidized Si substrate by sputtering using a metal mask. A ferromagnetic layer comprising $Co_8Pd_2$ grains and a $Al_2O_3$ material is formed by using $Co_8Pd_2$ in $1\times10^{-3}$ Torr Ar gas pressure and $Al_2O_3$ targets in $1\times10^{-5}$ Torr $O_2$ gas pressure. The substrate is applied with 300 W bias power during the formation. The third $Al_2O_3$ layer (preferably having a thickness of 1 nm) is formed as a cap layer (interlayer insulator) and the third $Co_8Pd_2$ layer (preferably having a thickness of 0.8 nm), the $Co_9Fe$ layer (preferably having a thickness of 10 nm), the NiFe layer (preferably having a thickness of 30 nm), and the second Au layer (preferably having a thickness of 200 nm) are formed in this order The stacked structure was annealed in magnetic fields at 300° C. so as to show uniaxial magnetic anisotropy.

Figure 24:
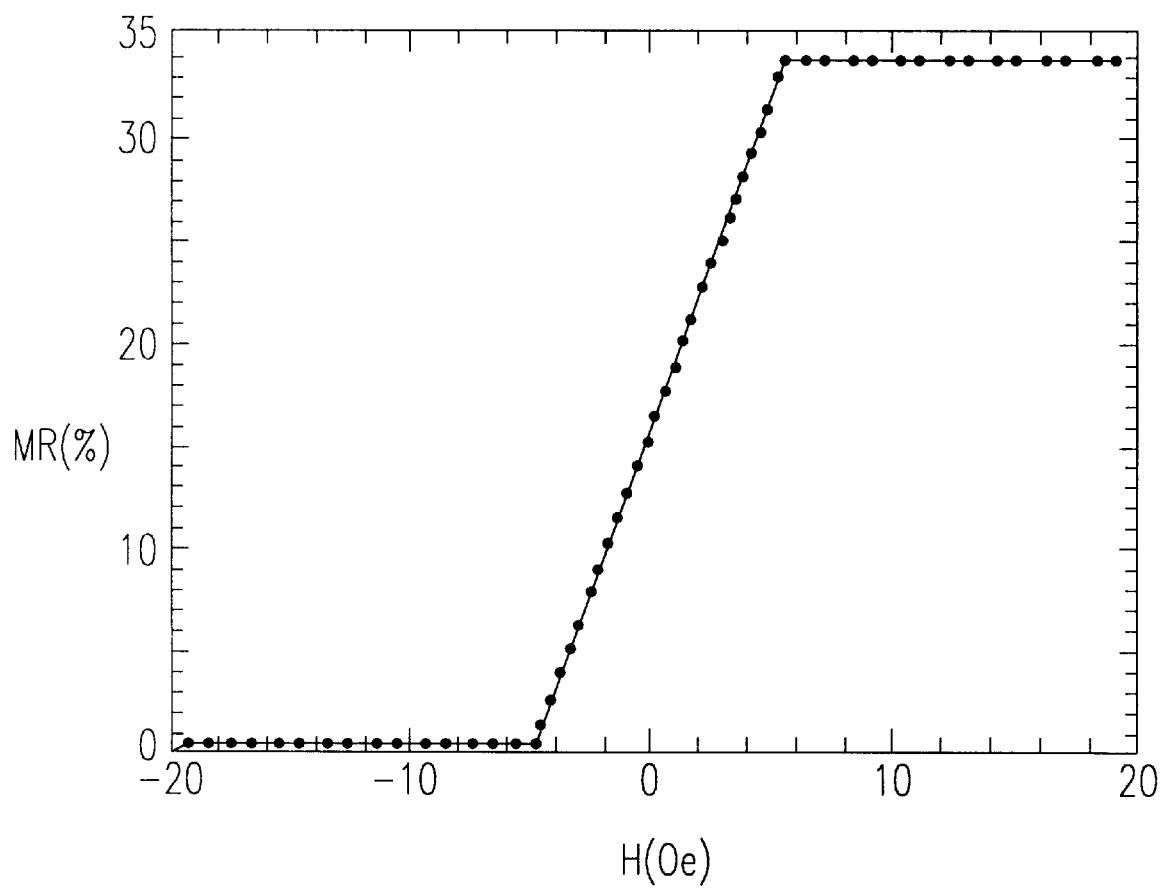
FIG. 24 is a graph illustrating experimental data of the magnetic field-magnetoresistance characteristics of the magnetic device of FIG. 23 according to the eighth embodiment of the present invention.

FIG. 24 is a graph illustrating experimental data of the magnetic field H(Oe)-magnetoresistance (MR) (%) of the magnetic device of FIG. 23 according to the eighth embodiment of the present invention. The MR amplitude of the device of the eighth embodiment shows a steep change at 5 Oe as shown in FIG. 24.

Table 1 shows 9 samples according to a ninth embodiment of the present invention. The stacked structure of these embodiments is coupled with a pair of 200 nm Au electrodes.

Each of the samples has the following film structure.

Sample 1 has a 20 nm NiFe layer, a 10 nm $Co_8Pt_2$ layer, a 1 nm AlN layer, (a ferromagnetic layer comprising $Fe_8Pt_2$ grains in an AlN material and an AlN layer)$_2$, and a 40 nm $Co_9Fe$ layer, successively formed in this order.

Sample 2 has a 30 nm NiMnSb layer, a 1 nm $SiO_2$ layer, a ferromagnetic layer comprising $Co_7Pd_3$ grains in a $SiO_2$ material, a 5 nm $Co_9Fe$ layer, and a 20 nm NiFe layer, successively formed in this order.

Sample 3 has a 30 nm Co layer, a 1 nm $Al_2O_3$ layer, a ferromagnetic layer comprising $Fe_8Pt_2$ grains in an $Al_2O_3$ material, a $Al_2O_3$ layer, and a 40 nm $Co_7Fe_3$ layer, successively formed in this order.

Sample 4 has a 30 nm $LaSrMnO_{3-y}$ layer, a 1 nm Co layer, a 1 nm $SiO_2$ layer, (a ferromagnetic layer comprising $Co_8Pt_2$ grains in a $SiO_2$ material)$_2$, a $SiO_2$ layer, a 5 nm $Co_9Fe$ layer, and a 20 nm NiFe layer, successively formed in this order.

Sample 5 has a 30 nm Fe layer, a 1 nm $CaF_2$ layer, (a ferromagnetic layer comprising $Co_8Pt_2$ grains in a $SiO_2$ material, a $SiO_2$ layer)$_2$, a 5 nm CoFe layer, and a 20 nm NiFe layer, successively formed in this order.

Sample 6 has a 20 nm NiFe layer, a 10 nm CoFe layer, a 1 nm AlN layer, (a ferromagnetic layer comprising a $Co_8Pt_2$ in a $SiO_2$ material, a $SiO_2$ layer)$_2$, a 10 nm $Co_9Fe$ layer, and a 20 nm NiFe layer, successively formed in this order.

Sample 7 has a 20 nm PtMn layer, a 10 nm $Co_8Fe_2$ layer, a 1 nm AlN layer, (a ferromagnetic layer comprising $Co_8Pt_2$ grains in an AlN material, an AlN layer)$_2$, a 20 nm $Co_9Fe$ layer, and a 20 nm NiFe layer, successively formed in this order.

Sample 8 has a 20 nm FeMn layer, a 20 nm NiFe layer, a 3 nm $Co_8Fe_2$ layer, a 1 nm $SiO_2$ layer, (a ferromagnetic layer comprising $Co_8Pt_2$ grains in a $SiO_2$ material, a $SiO_2$ layer)$_2$, a 2 nm $Co_9Fe$ layer, and a 30 nm NiFe layer, formed in this order.

Sample 9 has a 20 nm Fe layer, a 20 nm CoFe layer, a 1 nm $SiO_2$ layer, a $Co_8Pt_2$ layer, a $SiO_2$ layer, a 2 nm $Co_9Fe$ layer, and a 30 nm NiFe layer.

The MR amplitude is measured at a current at which the devices show the smallest resistance.

TABLE 1

| Sample No. | R (Ω) | MR amplitude (%) |
| --- | --- | --- |
| 1 | 0.6 | 37 |
| 2 | 0.45 | 31 |
| 3 | 0.4 | 2 |
| 4 | 0.5 | 31 |
| 5 | 0.7 | 29 |
| 6 | 0.3 | 41 |
| 7 | 0.5 | 28 |
| 8 | 0.6 | 38 |
| 9 | 0.5 | 39 |

Figure 25A:
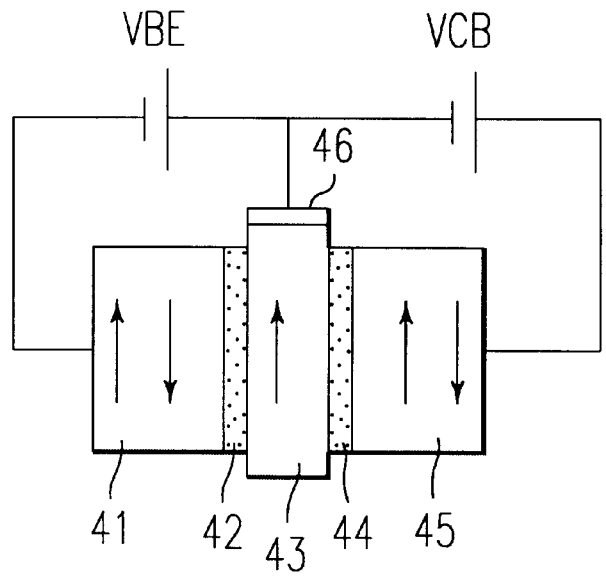
FIG. 25a is a schematic cross-sectional view showing a spin dependent conduction magnetic device according to a tenth embodiment of the present invention.
Figure 25B:
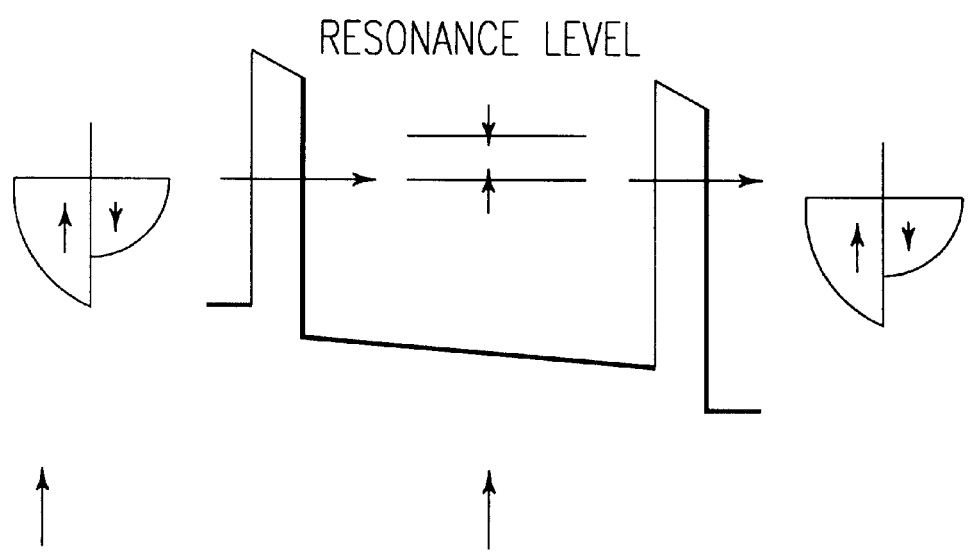
FIG. 25b is a schematic band diagram at two ferromagnetic tunnel junctions and showing spin directions of the magnetic device of FIG. 25a according to the tenth embodiment of the present invention.

FIG. 25a shows a diagram of a spin dependent conduction device according to a tenth embodiment of the present invention. FIG. 25b is an energy band level diagram showing the spin dependent conduction of the device of FIG. 25a according to the tenth embodiment of the present invention. The following description refers to the device using dielectric layers at tunnel junctions. The dielectric layers may be substituted with multi-tunnel junctions or a semiconductor.

The spin dependent conduction device comprises a first ferromagnetic layer 41, a first dielectric layer 42, a second ferromagnetic layer 43, a second dielectric layer 44, and a third ferromagnetic layer 45; these five layers are laminated as shown in FIG. 25a. Two tunnel junctions are formed between the first and the second ferromagnetic layers 41, 43 via the first ferromagnetic layer 42 and the second and the third ferromagnetic layers 43, and 45 via the second ferromagnetic layer 44.

Both the first ferromagnetic layer 41 and the third ferromagnetic layer 45 functions as an electrode. When the current is outlet to the third ferromagnetic layer 45, the third ferromagnetic layer 45 may be substituted with a nonmagnetic metal layer. Voltage is applied to the second ferromagnetic layer 43 by an electrode 46 coupled thereto.

The second ferromagnetic layer 43 is sufficiently thin to form discrete energy levels in the second ferromagnetic layer 43 by a quantum effect. The discrete energy levels are spin split by the quantum effect of the energy levels, and the discrete energy levels of upward spin (↑) and downward spin (↓) differ by coupling energy y.

The tunnel current flows at a first junction comprising the first and second ferromagnetic layers 41, 43 via the first dielectric layer 42 when a first voltage is applied between these two ferromagnetic layers 41, 43 and a second voltage of counter signs against the first voltage. The mechanism of the spin dependent resonance tunnel effect is as follows. One of the upward spin (↑) and downward spin (↓) of the discrete levels of the second ferromagnetic layer become resonant with conductive energy of the first ferromagnetic layer so as to have the same energy level as the conductive energy level. FIG. 25b shows a schematic diagram in which the upward spin energy level of the second ferromagnetic layer 43 is the same as that of the conductive energy level of the first ferromagnetic layer 41, for example. The tunnel electrons having the same energy level as the resonant energy level are not reflected at the surface of the first and the third ferromagnetic layers 41, 45 so as to show 100% transmittance. Electrons having another spin direction do not tunnel the junctions.

The number of electrons which tunnel from the first ferromagnetic layer 41 to the second ferromagnetic layer 43 via the resonant energy level differ depending on whether spin directions of these layers are parallel or antiparallel because the electrons having energy levels near Fermi level only contribute to the conduction and the number of the electrons depends on the spin directions. Tunnel currents differ depending on whether the magnetization direction of the first ferromagnetic layer 41 is parallel or anti parallel to the fixed magnetization direction of the third ferromagnetic layer 45 and a large MR amplitude is obtained. The third ferromagnetic layer 45 may be formed of a conductive material and substituted with nonmagnetic metal layer.

The ferromagnetic layer 41, the second ferromagnetic layer 43, and the third ferromagnetic layer 45 are namely emitter, base, and collector of a transistor. A base current lb flows between the emitter and the base at an applied voltage Veb. A collector current Ic flows between the base and the collector at an applied voltage Vcb of negative sign. The collector electrode Ic becomes larger than the base current lb (the transistor amplifies the current.)

The spin dependent conduction also appears when the spin directions of the two ferromagnetic layers 41, 45 form a relative angle θ. The tunnel current is in proportion to cosine θ, and the relative angle θ is measured by sensing the current which flows through the junctions. The spin direction may be measured and the current is amplified by controlling the bias voltage Vcb.

Figure 26:
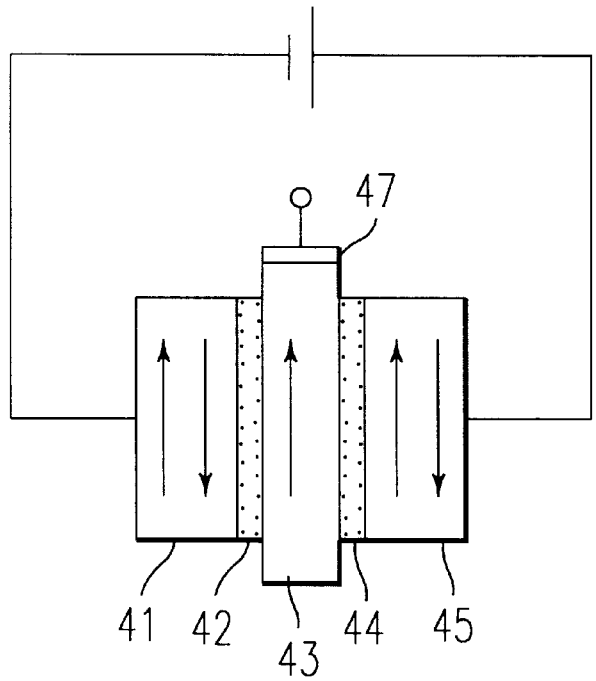
FIG. 26 is a schematic cross-sectional view showing a magnetic device according to an eleventh embodiment of the present invention.

FIG. 26 shows a diagram of a transistor according to an eleventh embodiment of the present invention.

The transistor comprises a first ferromagnetic layer 41, a first dielectric layer 42, a second ferromagnetic layer 43, a second dielectric layer 44, and a third ferromagnetic layer 45. A voltage source is coupled to the first and third ferromagnetic layers 41 and 45, respectively. The second ferromagnetic layer 43 is coupled to an electrode 47 which applies a bias voltage to the second ferromagnetic layer 43. A tunnel current flows by applying a voltage between the first ferromagnetic layer 41 and the third ferromagnetic layer 45 and also by applying the bias voltage to the second ferromagnetic layer 43 so as to control (shift) the discrete energy level of the second ferromagnetic layer 43.

Figure 27:
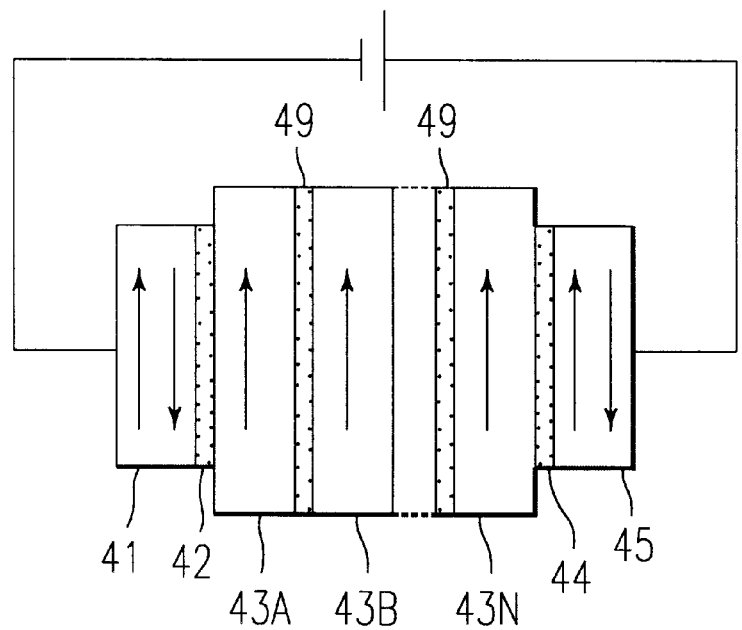
FIG. 27 is a schematic cross-sectional view showing a modified magnetic device according to the eleventh embodiment of the present invention.

FIG. 27 is a schematic cross-sectional view of a modified transistor according to the eleventh embodiment of the present invention. The second ferromagnetic layer 43 may be substituted with a multi-layer structure having a plurality of ferromagnetic layers 43 n (n=a, b, . . . , n) and dielectric layers interposed between each of the adjacent ferromagnetic layers 49, as shown in FIG. 27. The multi-layer structure may have a spin dependent resonance state by controlling the discrete energy level of the multi-layer structure.

The ferromagnetic material of the first, second, and third ferromagnetic layers may be selected from materials in above-described embodiments.

The spin direction of the first ferromagnetic layer 41 may be changed by applying a coercive force difference between the first and the third ferromagnetic layers 41, 43 or magnetic coupling with an antiferromagnetic layer and the ferromagnetic layer disposed adjacent to the antiferromagnetic layer. The film thickness of the second ferromagnetic layer 43 may be thin enough to have discrete energy levels, such as 5 nm or less. The film thickness of the first and the third ferromagnetic layers is not restricted and may be, for example, in the range from 0.1 nm to 100 nm. The film thickness of the dielectric layers 42, 44 may be, for example, in the range from 0.5 to 5 nm.

Figure 28A:
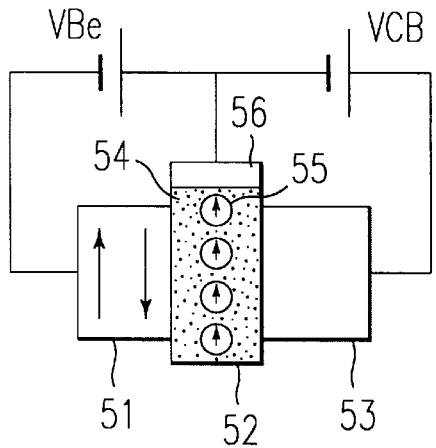
FIG. 28a is a schematic cross-sectional view showing a magnetic device according to a twelfth embodiment of the present invention.
Figure 28B:
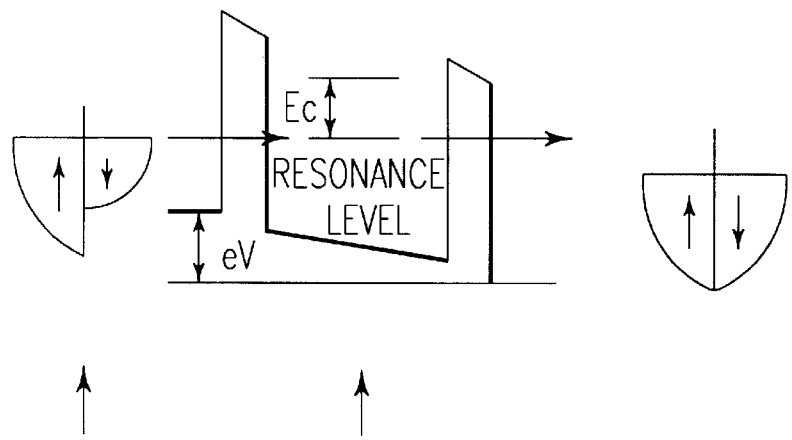
FIG. 28b is a schematic energy band diagram at two ferromagnetic tunnel junctions of the magnetic device and showing spin directions of the magnetic device of FIG. 28a according to the twelfth embodiment of the present invention.

FIG. 28a shows a schematic diagram of a magnetic device affording to a twelfth embodiment. FIG. 28b is a schematic energy band diagram at two ferromagnetic tunnel junctions of the magnetic device and showing spin directions of the magnetic device of FIG. 28a according to the twelfth embodiment of the present invention. The device has a spin dependent resonance effect at room temperature. The device comprises a first electrode 51, a granular ferromagnetic layer 52, a nonmagnetic second electrode 53, and a bias electrode 56. The first electrode 51, the granular ferromagnetic layer 52, and the second electrode 53 is laminated as shown in FIG. 28a. The granular ferromagnetic layer 52 comprises a plurality of ferromagnetic grains 55 scattered in a nonmagnetic material 54. The granular layer 52 has a finite coercive force and has ferromagnetism rather than paramagnetism. Two tunnel junctions are formed between the grains 55 and each of the electrodes 51, 53 via part of the nonmagnetic material 54. The electrode 51 preferably is formed of ferromagnetic material, and nonmagnetic material of the second electrode 53 may be substituted with ferromagnetic material. An insulator layer which is thin enough to let the tunnel current path through itself may be interposed between one of the electrodes 51, 53 and the granular ferromagnetic layer 52.

When a positive (negative) voltage Vbe is applied to the granular ferromagnetic layer 52 through the first electrode 51 and the electrode 56 and negative (positive) voltage Vcb is also applied through the electrode 56 and the second electrode 13, as shown in FIG. 28a, the discrete energy levels are formed in the grain 55. The grain 55 has a sufficiently small size and is surrounded by the nonmagnetic material 54, as shown in FIG. 28b, by the effect of electrostatic energy Ec originated by the Coulomb Blockade effect. The energy Ec is expressed by $e2/2C$, where e is electric charge of electron and C is capacity of the grain. In this manner, the resonance tunnel levels are obtained and the magnetoresistance becomes small. When the discrete level is controlled by the electrode 56 to be moved from the resonance state, the magnetoresistance becomes large by the Coulomb Blockade effect. A large MR amplitude is obtained by reversing the magnetization direction of the ferromagnetic layer 51 to be parallel/antiparallel in relation with the magnetization direction of the fixed magnetization direction of the layer 52.

The MR amplitude becomes small when the grain's electrostatic energy is controlled to be off the resonance state, and the magnetoresistance effect becomes small. The magnetic device has a new function to control its MR effect by the electrode 56.

Figure 29:
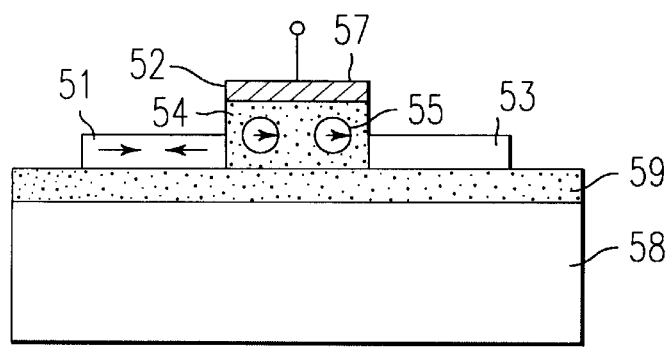
FIG. 29 is a schematic cross-sectional view showing a modified magnetic device according to the twelfth embodiment of the present invention.

FIG. 29 is a schematic cross-sectional view showing a modified magnetic device according to the twelfth embodiment of the present invention. The relative angle between the first electrode 51 and the ferromagnetic granular layer 52 may be measured as described in the eleventh embodiment. The magnetic device of this embodiment can be modified to include an electrode 57 for applying voltage to the granular layer 52, as shown in FIG. 29. The electrode 57 applies gate voltage Vg to the granular layer 52. The tunnel current flows the granular layer 52 by applying voltage between the first electrode 51 and the second electrode 53. The discrete energy level of the grains 55 can be controlled by Vg to be off or in the resonance state. Reference numeral 58 is a substrate and reference numeral 59 is a nonmagnetic insulator layer in FIG. 29.

Figure 30:
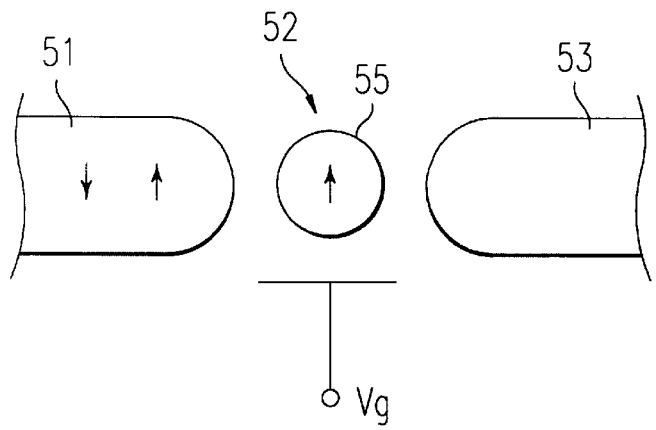
FIG. 30 is a schematic view showing another modified magnetic device according to the twelfth embodiment of the present invention.

FIG. 30 is a schematic view showing another modified magnetic device according to he twelfth embodiment of the present invention. A quantum clot may be preferably formed by a single grain 55 in the material 54, as shown in FIG. 30.

The device of this embodiment may include a plurality of granular layers 52 or a stacked film comprising both a granular layer and a ferromagnetic layer.

The granular layer 52 may have a finite coercive force and have less saturation magnetization than a conventional granular layer. The electric resistance of the granular layer 52 is smaller than that of the junction that includes the dielectric later 44 and can be preferably controlled by the grain volume packed ratio in the granular layer 52, the current path in the granular layer 52, the grain size, or the scattered material.

Co, CoPt alloy, FePt alloy, or an alloy comprising a transition metal and a rare earth metal may be chosen for their large magnetic anisotropy so that the granular layer 52 has a finite coercive force. The grains 15 may preferably be arranged to be one or two layers so as to form a uniform tunnel barrier.

A hard magnetic layer for applying magnetic fields may be introduced adjacent to opposite ends of a relatively small coercive force granular layer. An antiferromagnetic layer may also be introduced to fix the magnetization direction of the small coercive force granular layer 52.

The grain size may preferably be 1 nm or more so as not to have super-paramagnetism. On the other hand, the size preferably is 10 nm or less so as not to provide long grain interval. The interval may preferably be 5 nm or less for smooth tunnel current flow.

Various dielectric materials, such as $Al_2O_3$, $SiO_2$, MgO, $MgF_2$, $Bi_2O_3$, AlN, $CaF_2$ may be used to form the material 54. The oxide, fluoride, and nitride materials may have non-problematic dangling bonds in the film surface.

Ferromagnetic materials of the first electrode 51 preferably have a coercive force difference between the granular layer 52 and may be chosen from well-known ferromagnetic materials, such as identified in the above embodiment.

Half metal may preferably be used for the first electrode 51 so as to obtain a large MR amplitude, because in the half metal, only electrons of specific spin direction contribute to conduction.

The ferromagnetic material for the second electrode 53 may be chosen so as to have coercive force difference from the granular layer 52. The first electrode 51 may be substituted with a stacked film structure comprising ferromagnetic layers and nonmagnetic layers, each interposed between the ferromagnetic layers so that the ferromagnetic layer is antiparallel in relation to the adjacent ferromagnetic layer by the effect of ferromagnetic coupling or static magnetic coupling. The stacked structure is preferable because it does not produce stray fields. The first ferromagnetic layer 51 may be substituted with another stacked structure comprising ferromagnetic layers and semiconductor layers, each interposed between the ferromagnetic layers. The spin direction of the second modification may be turned around and recorded by annealing or lighting the stacked film without applying bias magnetic fields to the film. The semiconductor material may be chosen from the group consisting of B20 structure FeSi alloy, $\beta$-$FeSi_2$, and GaAs.

The granular layer 52 and the first electrode 51 may be applied unidirectional magnetic anisotropy in its film plane so as to show a quick turn of the magnetization and stable magnetization. The unidirectional magnetic anisotropy is preferable for a magnetic memory device. The thickness of the granular layer 52 and the first electrode 51 may be in the range of 0.5 nm to 100 nm. The thickness of the granular layer 52 may preferably be uniform and be 50 nm or less to obtain fine tunnel conduction.

Figure 31:
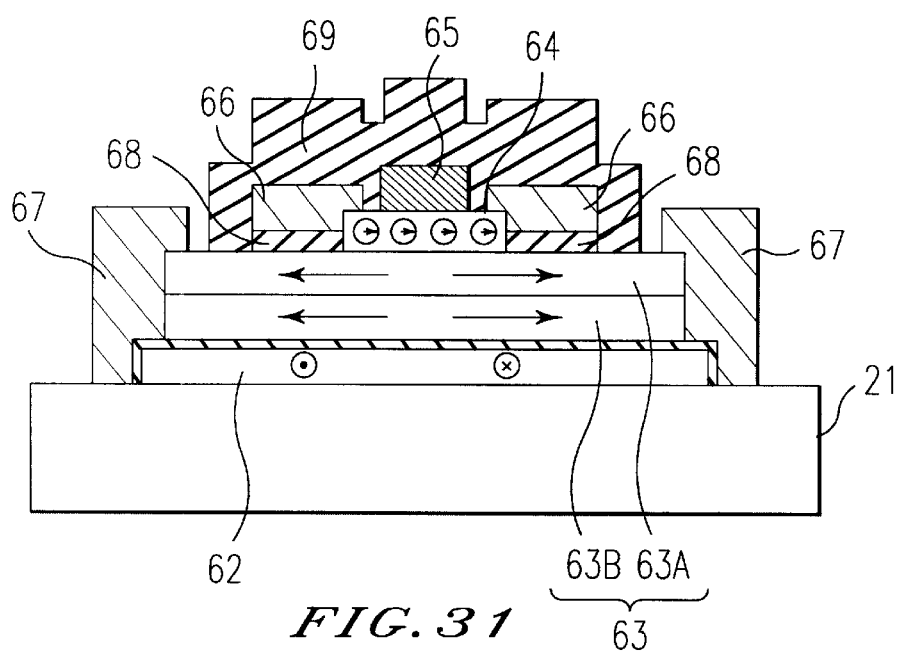
FIG. 31 is a schematic cross-sectional view showing a tri-terminal magnetic device according to a thirteenth embodiment of the present invention.

FIG. 31 shows a cross-sectional view of a tri-terminal magnetic device according to a thirteenth embodiment of the present invention.

A conductive layer 62, a pair of ferromagnetic layers 63 (63a, 63b), a granular layer 64, and a metal layer (gate electrode) 65 are formed in this order on a substrate 21 so that the granular layer 64 is interposed between the ferromagnetic layer 63a and the gate electrode 66, as shown in FIG. 31. The ferromagnetic layer 63b applies magnetic bias fields to the ferromagnetic layer 63a so as to lower the coercive force of the ferromagnetic layer 63a and may be omitted when the coercive force of the ferromagnetic layer 63a is small enough. The conductive layer 62 may be used to change the magnetization direction of the ferromagnetic layers 63 by current flow. The granular layer 64 receives a voltage bias and is coupled to two pairs of electrodes 66, 67 and receives current flow through the electrodes 66, as shown in FIG. 31. An insulator layer 68 is interposed to insulate the electrode 66 and the ferromagnetic layer 63a, as shown in FIG. 31. The device may be covered with an insulator protection layer 69, as shown in FIG. 31. One electrode of the pairs 66, 67 may be omitted.

The grains in the granular layer 64 are small enough and the discrete energy levels are formed in the granular layer 64 by electrostatic energy of the Coulomb Blockade effect. A tunnel current starts to flow by applying a voltage between one of the pair of electrodes 66 and one of the pair of electrodes 67 and the discrete energy level of the granular layer 64 may be controlled by the gate electrode 65.

A large MR amplitude may be obtained when the discrete energy level of the granular layer 64 may be controlled by the gate electrode 65 to be different from the energy level of the conduction electron in the ferromagnetic layers 63. On the other hand, a small magnetic resistance may be obtained by a resonant tunneling effect, which appears when the discrete energy level of the granular layer may be substantially the same as that of the conduction electron of the layers 63. Therefore, the spin direction of the granular layer 64 may be sensed by applying a bias voltage and without applying outer magnetic fields. The spin direction of the ferromagnetic layers 63 turns around by applied magnetic fields produced by current flow in the conductive layer 62, as shown in FIG. 31.

The device shown in FIG. 31 may be formed by the following steps.

The main surface of the substrate 21 may be oxidized by the thermal annealing method beforehand. The conductive layer 62 may comprise Cu and be formed on the main surface of the substrate 21. A 20 nm Fe layer (the ferromagnetic layer 63b) and a 10 nm $Co_{80}Pt_{20}$ (the ferromagnetic layer 63a) are formed above the Cu layer 62. The 10 nm granular layer 64 is formed on the ferromagnetic layer 63a simultaneously using $Co_{80}Pt_{20}$ alloy and $SiO_2$ targets of 2 m Torr Ar gas pressure and 400 W substrate bias. The obtained granular layer is observed by Transmittance Electron Microscopy (TEM) and has $Co_{80}Pt_{20}$ alloy grains layered in a $SiO_2$ material. The total amount of the grains in the layer is about 50%. The grain size is about 5 nm and the interval between grains is about 1.5 nm. The coercive force of the granular layer 64 is about 600 Oe and shows clear hysteresis without super-paramagnetism.

Figure 33:
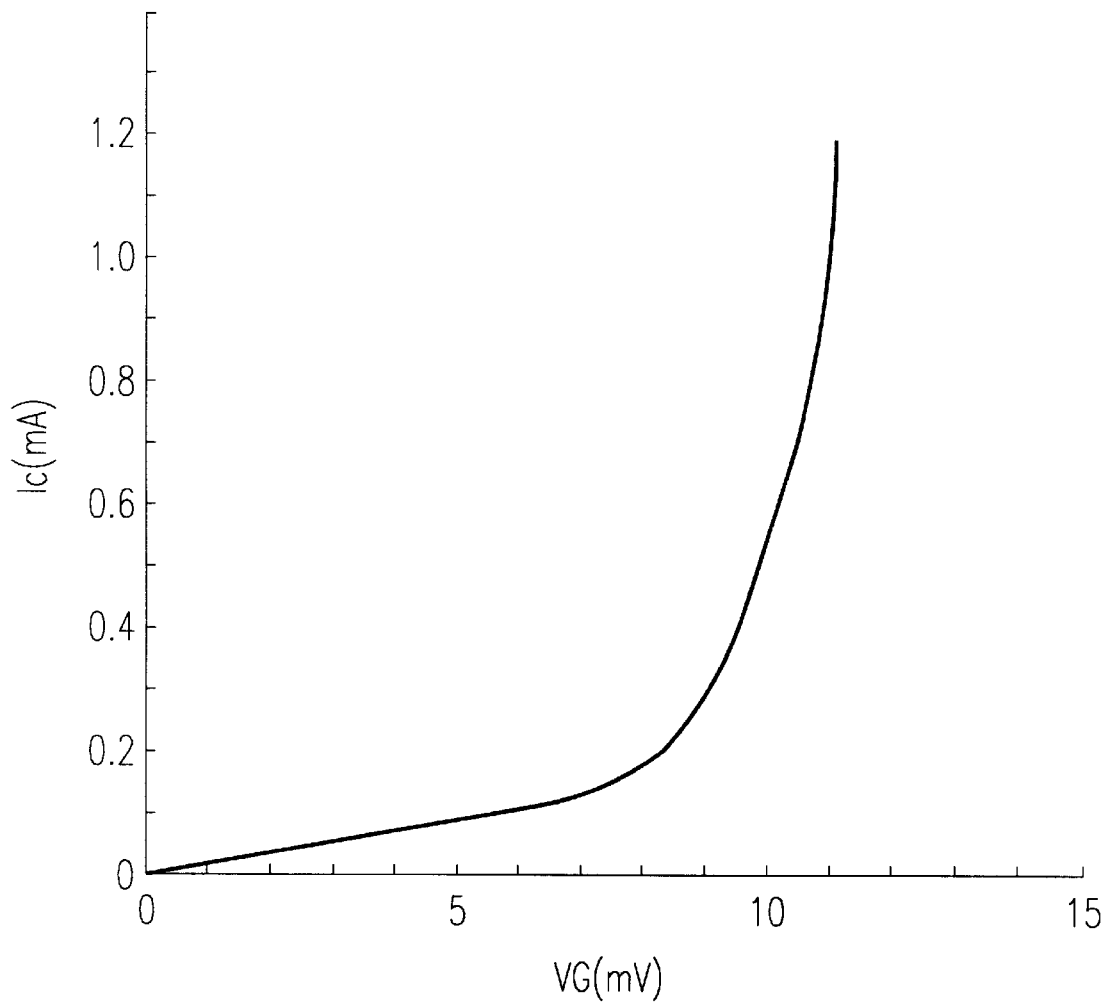
FIG. 33 is a graph illustrating experimental data of gate voltage-collector current of the magnetic device of FIG. 31 according to the thirteenth embodiment of the present invention.

FIG. 33 shows a voltage (Vg)(mV)-collector current (Ic)(mA) characteristic of the spin transistor of the thirteenth embodiment. The collector current Ic is a tunnel current flowing through the granular layer 64 to the ferromagnetic layer by applying voltage between electrodes 66, 67 and bias voltage Vg to the gate electrode 65. The spin directions of the ferromagnetic layers 63 are changed by magnetic fields of current flow through the conductive layer 62. FIG. 33 shows parallel spin direction state and shows a rapid increase of Ic by occurrence of a resonant tunnel current at around 10 mV.

Figure 34:
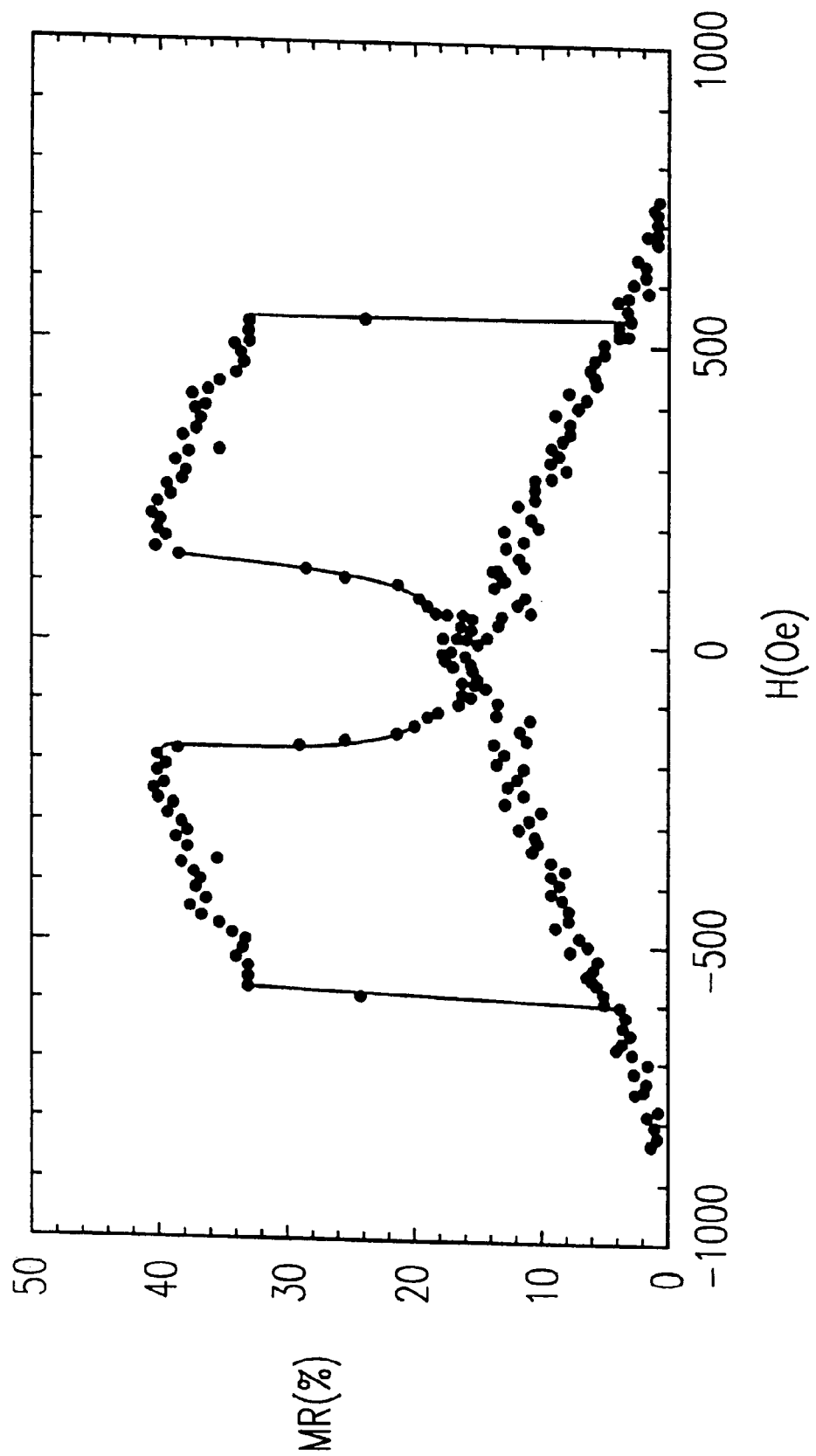
FIG. 34 is a graph illustrating experimental data of magnetic field-magnetoresistance of the magnetic device of FIG. 31 according to the thirteenth embodiment of the present invention.

FIG. 34 shows a change of Ic as resistance amplitude. The MR amplitude (ΔR/Rs where Rs is resistance under saturation magnetization fields) when Vg=0 is large enough as 45%. On the other hand, the MR amplitude when Vg=11 mV is 15%.

Figure 32:
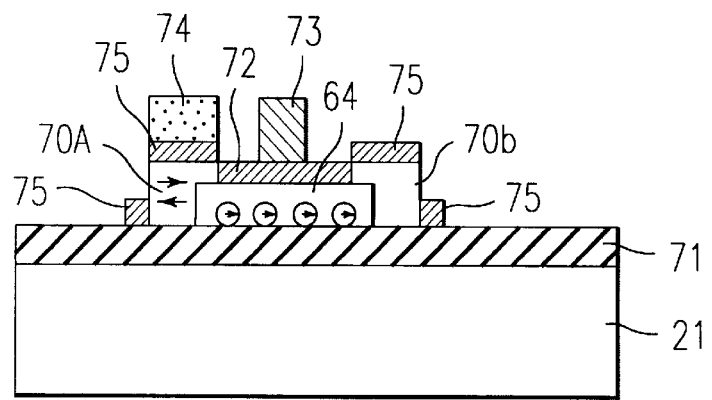
FIG. 32 is a schematic cross-sectional view showing a tri-terminal magnetic device according to a fourteenth embodiment of the present invention.

FIG. 32 shows a cross-sectional view of a tri-terminal magnetic device according to a fourteenth embodiment of the present invention.

A granular layer 64 is interposed between a pair of electrodes 70a, 70b and arranged in one plane, as shown in FIG. 32. The granular layer 64 and the pair of electrodes 70a, 70b are disposed on a substrate 21 with an insulator layer 71 interposed therebetween, as shown in FIG. 32. The electrode 70a may be a ferromagnetic layer. An electrode (gate electrode) 73 for applying a bias voltage between the substrate 21 and itself is disposed above the granular layer 64 with an insulator layer 72 interposed therebetween, as shown in FIG. 32. The gate voltage biasing method of this device is similar to that of a Field Effect Transistor.

The discrete energy level of the granular layer 64 is shifted to be different from that of the conduction electron of the electrode 70a by applying a bias voltage from the electrode 73 and then large tunnel current depending on spin directions of the ferromagnetic layer 70a and the granular layer 64 flows. The spin direction of one of the ferromagnetic layer 70a and the granular layer 64 having less coercive force than the other layer may be turned around. The spin direction of the ferromagnetic layer 30a may be reversed by current flow in the conductive layer 74 stacked and insulated from the ferromagnetic layer 30a by an insulator layer 75.

The discrete energy level of the granular layer 64 may be controlled to be substantially equal to the conduction electron energy level of the electrode by the gate electrode 73.

A magnetic device using one of $SiO_2$, AlN, MgO, $Bi_2O_3$, $MgF_2$, and $CaF_2$ as dielectric layers may show the same characteristic as shown in FIGS. 16, 17.

A magnetic device using one of $SiO_2$, AlN, MgO, $Bi_2O_3$, $MgF_2$, and $CaF_2$ as dielectric layers may show the same characteristic as in the above-described embodiments.

Au layers that are 200 nm thick may be used as underlayer and cap layer in the above embodiments to minimize electrode resistance because the junction area is comparative large, such as 100×100 square microns. When a junction area of several square nanometers is provided, the Au layers are not necessary.

Figure 35:
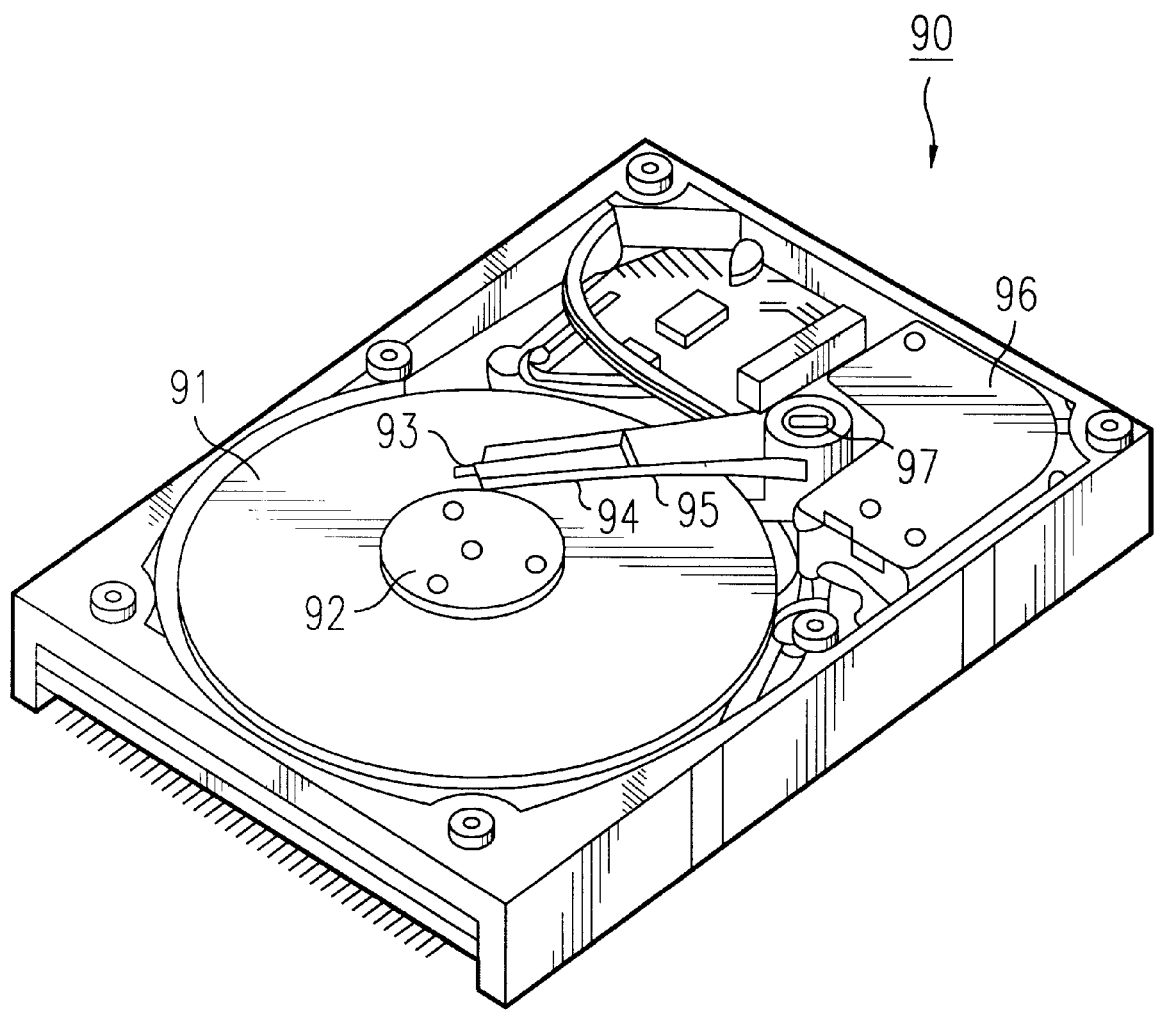
FIG. 35 is a schematic view of a Hard Disk Drive according to one embodiment of the present invention.

FIG. 35 shows a schematic view of Hard Disk Drive (HDD) 90 as an embodiment of a magnetic disk system according to the present invention.

A magnetic disk 91 is set to a spindle 92 and rotated by control of a motor. A head slider 93 is attached to the tip of a suspension 94. The head slider 93 has a magnetic head described above. The suspension 94 is connected at one end of an actuator arm 95, and another end of the actuator arm 95 is formed with a voice coil motor 96. The voice coil motor 96 may be a linear motor. The actuator arm 95 is supported by a ball bearing (not shown) formed at the upper and bottom surfaces of a fixed axis 97 and can rotate by the voice coil motor 96.

Wherein the present invention has been particularly shown and described with reference to preferred embodiments thereof, it will be understood by those skilled in the art that various other changes in the form and details may be made therein without departing from the spirit and scope of the invention.

What is claimed is:

1. A magnetic device comprising:
   first and second tunnel barrier layers,
   a first ferromagnetic layer disposed between the first and the second tunnel barrier layers, the first ferromagnetic layer having discrete energy levels,
   a second ferromagnetic layer disposed adjacent to one of the first and the second tunnel barrier layers so that said one of the first and the second tunnel barrier layers is between the first and the second ferromagnetic layers, and
   first and second electrodes coupled to another one of the first and second tunnel barrier layers and the second ferromagnetic layer, respectively.

2. A magnetic device, as set forth in claim 1, further comprising a current detector detecting variations in tunnel current, the tunnel current flows via the discrete energy level, and the variations in tunnel current are due to change of magnetization direction of the first ferromagnetic layer or the second ferromagnetic layer.

3. A magnetic device, as set forth in claim 1, wherein the first ferromagnetic layer has a grain in a nonmagnetic material.

4. A magnetic device, as set forth in claim 1, wherein the first ferromagnetic layer has a plurality of grains scattered in a nonmagnetic material.

5. A magnetic device, as set forth in claim 1, wherein the magnetic device has a spin polarization tunnel effect.

6. A magnetic device, as set forth in claim 1, wherein the second ferromagnetic layer is merged with one of the second electrodes.

7. A magnetic device, as set forth in claim 1, wherein the pair of tunnel barrier layers is formed of dielectric material or semiconductor material.

8. A magnetic device, as set forth in claim 1, wherein the magnetic device has spin dependent resonance tunnel effect.

9. A magnetic device, as set forth in claim 1, wherein a magnetization direction of one of the first and the second ferromagnetic layer is fixed and a magnetization of another of the first and the second ferromagnetic layer is substantially rotatable.

10. A magnetic device, as set forth in claim 1, further comprising a third tunnel barrier layer, and a third ferromagnetic layer disposed adjacent to the third tunnel barrier layer so as to sandwich the third tunnel carrier layer with the first ferromagnetic layer.

11. A magnetic device, as set forth in claim 1, further comprising a third electrode separated from the first ferromagnetic layer through a third tunnel barrier layer.

12. A magnetic device, as set forth in claim 11, wherein the third electrode controls the discrete energy levels of the first ferromagnetic layer.

13. A magnetic device, as set forth in claim 11, wherein the magnetic device has a current gain function.

14. A magnetic device, as set forth in claim 1, wherein the magnetic device has at least a 30% MR amplitude at room temperature, where the magnetoresistance amplitude is defined by $\Delta R/Rs$, where $\Delta R$ is a resistance change of the device and Rs is a device resistance at saturation magnetization fields.

15. An integrated memory device comprising:
a plurality of word lines,
a plurality of data lines,
a plurality of memory cells, each of the memory cells coupled to a corresponding one of the plurality of word lines and to a corresponding one of the plurality of data lines, each of the memory cells having:
first and second tunnel barrier layers,
a first ferromagnetic layer disposed between the first and the second tunnel barrier layers and having discrete energy levels,
a second ferromagnetic layer disposed adjacent to one of the first and the second tunnel barrier layers so that said one of the first and the second tunnel barrier layers is between the first and the second ferromagnetic layers, and
first and second electrodes coupled to another one of the first and the second tunnel barrier layers and the second ferromagnetic layer respectively,
each of the plurality of data lines connecting one of the first and second electrodes of a corresponding portion of the plurality of memory cells to a current detector for detecting variations in a tunnel current flow via the discrete energy level in the first ferromagnetic layer, the variations in tunnel current due to change of a magnetization direction of one of the first and the second ferromagnetic layers.

16. An integrated memory device, as set forth in claim 15, wherein the second ferromagnetic layer is merged with one of the first and the second electrodes.

17. A magnetic sensor, comprising:
first and second tunnel barrier layers,
a first ferromagnetic layer disposed between the first and the second tunnel barrier layers and having discrete energy levels,
second and third ferromagnetic layers disposed adjacent to the first and the second tunnel barrier layers, respectively, so that the first and the second tunnel barrier layers are between the first ferromagnetic layer and the respective second and third ferromagnetic layers, and
a pair of electrodes coupled to the first and the second tunnel barrier layers and the second ferromagnetic layer, and
a current detector for detecting variations in tunnel current flow, the tunnel current flow being via the discrete energy level in the first ferromagnetic layer, the variations in tunnel current due to change of magnetization direction of one of the first and the second ferromagnetic layers.

18. A magnetic sensor, as set forth in claim 17, wherein the second ferromagnetic layer is merged with one of the pair of electrodes.

19. A magnetic head comprising:
a pair of tunnel barrier layers,
a first ferromagnetic layer disposed between the first and the second tunnel barrier layers, and having discrete energy levels,
second and third ferromagnetic layers disposed adjacent to a respective one of the pair of tunnel barrier layers so that said respective one of the pair of tunnel barrier layers is between the first and the corresponding one of the second and third ferromagnetic layers, and
an antiferromagnetic layer coupled to the third ferromagnetic layer.

20. A magnetic head, as set forth in claim 19, further comprising a current detector for detecting variations in tunnel current flow, the tunnel current flow being via the discrete energy level in the first ferromagnetic layer, the variations in tunnel current due to change of magnetization direction of one of the first, the second, or third ferromagnetic layers.

21. A magnetic head, as set forth in claim 19, further comprising another antiferromagnetic layer coupled to another of the second and third ferromagnetic layers.

22. A magnetic disk system comprising:
a magnetic disk, a magnetic head for communicating information with the magnetic disk, and comprising:
first and second tunnel barrier layers,
a first ferromagnetic layer disposed between the first and the second tunnel barrier layers and having discrete energy levels,
a second ferromagnetic layer disposed adjacent to one of the first and second tunnel barrier layers so that said one of the first and the second tunnel barrier layers is between the first and the second ferromagnetic layers,
first and second electrodes coupled to another one of the first and second tunnel barrier layers and the second ferromagnetic layer, respectively, and
a current detector for detecting variations in tunnel current flow, the tunnel current flow being via the discrete energy level in the first ferromagnetic layer, the variations in tunnel current due to change of magnetization direction of one of the first and the second ferromagnetic layers.

23. A magnetic disk system, as set forth in claim 21, wherein the second ferromagnetic layer is merged with one of the first and the second electrodes.

24. A magnetic device comprising:
a first ferromagnetic layer having discrete energy levels;
first and second dielectric layers disposed adjacent to and on opposite sides of the first ferromagnetic layer; and
first and second electrodes disposed adjacent to the first and second dielectric layers, respectively.

25. The magnetic device of claim 24, wherein a second ferromagnetic layer is disposed between the second electrode and the second dielectric layer.

26. The magnetic device of claim 25 wherein the first and second ferromagnetic layers each have a spin direction, the spin directions being substantially perpendicular to each other.

27. The magnetic device of claim 24 wherein a magnetization direction of one of the first and second ferromagnetic layers is fixed and the magnetization direction of another one of the first and second ferromagnetic layers is rotatable.

28. The magnetic device of claim 24 further comprising a third electrode coupled to the first ferromagnetic layer to control the discrete energy level of the first ferromagnetic layer.

29. The magnetic device of claim 24 wherein the first ferromagnetic layer may be formed of a soft magnetic material.

30. The magnetic device of claim 29 wherein the soft magnetic material may be selected from the group of a Ni-Fe alloy, a half-metal material, a perovskite oxide half-metal, and an amorphous alloy.

31. The magnetic device of claim 24 further comprising second and third ferromagnetic layers disposed between the first dielectric layer and the first electrode and between the second dielectric layer and the second electrode, respectively, and wherein at least one of the first and second electrodes includes an antiferromagnetic layer adjacent to the corresponding one of the second and third ferromagnetic layers.

* * * * *